(12) United States Patent
Matsumoto

(10) Patent No.: US 7,157,819 B2
(45) Date of Patent: Jan. 2, 2007

(54) AXIAL FAN MOTOR WITH A LAMINATED CASING

(75) Inventor: Kaoru Matsumoto, Miyota-machi (JP)

(73) Assignee: Minebea Co., Ltd., Nagano-ken (JP)

( * ) Notice: Subject to any disclaimer, the term of this patent is extended or adjusted under 35 U.S.C. 154(b) by 4 days.

(21) Appl. No.: 11/281,460

(22) Filed: Nov. 18, 2005

(65) Prior Publication Data

US 2006/0066161 A1    Mar. 30, 2006

Related U.S. Application Data

(62) Division of application No. 10/040,470, filed on Jan. 9, 2002, now Pat. No. 7,034,418.

(30) Foreign Application Priority Data

Jan. 16, 2001    (JP) ............................. 2001-007125

(51) Int. Cl.
- H02K 7/20 (2006.01)
- H02K 5/20 (2006.01)
- H02K 5/18 (2006.01)
- H02K 5/173 (2006.01)
- H02K 5/22 (2006.01)

(52) U.S. Cl. .................. 310/67 R; 310/89; 310/64; 361/697; 417/423.8; 417/423.14; 165/121; 165/80.3

(58) Field of Classification Search ............ 310/67 R, 310/89, 90, 91, 64, 216; 361/695, 697; 165/121–126, 165/80.3; 417/423.1, 423.8, 423.14, 354
See application file for complete search history.

(56) References Cited

U.S. PATENT DOCUMENTS

| 5,288,203 A | * | 2/1994 | Thomas | 165/80.3 |
| 5,335,722 A | | 8/1994 | Wu | 165/122 |
| 5,407,324 A | * | 4/1995 | Starnes et al. | 415/208.5 |
| 5,502,619 A | | 3/1996 | Wang | 361/697 |
| 5,559,674 A | * | 9/1996 | Katsui | 361/697 |
| 5,583,746 A | | 12/1996 | Wang | 361/697 |
| 5,707,205 A | * | 1/1998 | Otsuka | 415/119 |
| 5,822,186 A | | 10/1998 | Bull et al. | 361/695 |

(Continued)

FOREIGN PATENT DOCUMENTS

JP    60204236    10/1985

(Continued)

Primary Examiner—Karl Tamai
(74) Attorney, Agent, or Firm—Bacon & Thomas, PLLC

(57) ABSTRACT

Disclosed is an axial fan motor for air-cooling a heat sink of a heating element and thermally connected to the heat sink. The casing of the axial fan motor is formed of a plurality of laminated metal plates. The plurality of metal plates include a single first metal plate and a plurality of second metal plates. The single first metal plate, which is an outermost layer located at the air exhaust side of the fan, has a peripheral portion, a central portion, and a plurality of arm portions for connecting the peripheral portion and the central portion. A bearing holder for supporting a rotary shaft of the fan is attached to the central portion. Each of the plurality of second metal plates is selected from a first-type second metal plate having a peripheral portion only, a second-type second metal plate having a peripheral portion only and assuming an outline of greater size than the outline of the first-type second metal plate, and a third-type second metal plate having a peripheral portion only, having a single cutout portion formed in the peripheral portion, and assuming an outline substantially equal in size to that of the first-type second metal plate.

8 Claims, 17 Drawing Sheets

U.S. PATENT DOCUMENTS

| | | | | |
|---|---|---|---|---|
| 5,896,917 A | * | 4/1999 | Lemont et al. | 165/80.3 |
| 5,982,064 A | * | 11/1999 | Umeda et al. | 310/90 |
| 5,988,995 A | * | 11/1999 | Hong | 417/423.14 |
| 6,132,171 A | * | 10/2000 | Fujinaka et al. | 415/208.5 |
| 6,193,205 B1 | * | 2/2001 | Wang | 248/510 |
| 7,034,418 B1 | * | 4/2006 | Matsumoto | 310/67 R |

FOREIGN PATENT DOCUMENTS

| | | |
|---|---|---|
| JP | 01278248 | 8/1989 |
| JP | 03277151 | 9/1991 |
| JP | 04017556 | 1/1992 |
| JP | 10/054386 * | 2/1996 |
| JP | 100054386 | 2/1998 |
| JP | 10154889 | 9/1998 |
| JP | 11075340 | 3/1999 |
| JP | 11098755 | 9/1999 |
| JP | 2000-220597 * | 8/2000 |
| JP | 20002/20597 | 8/2000 |
| JP | 2000341902 | 8/2000 |
| JP | 2002224795 | 11/2000 |
| JP | 2002/039099 | 6/2002 |

\* cited by examiner

FIG. 4
(A) 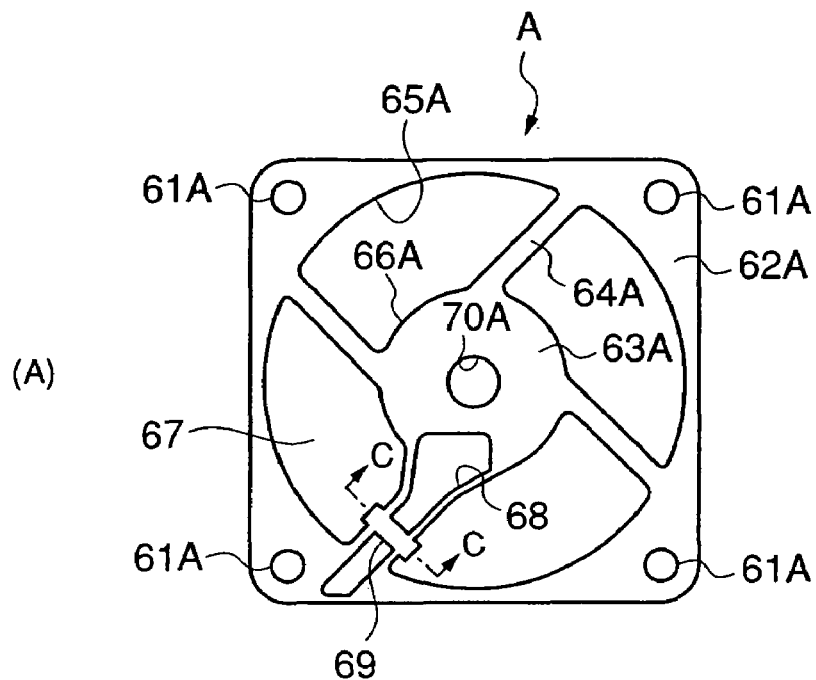
(B) 
(C) 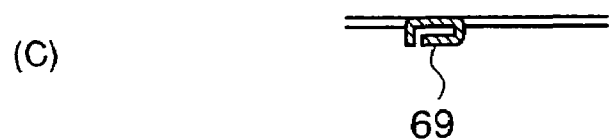

F I G.5
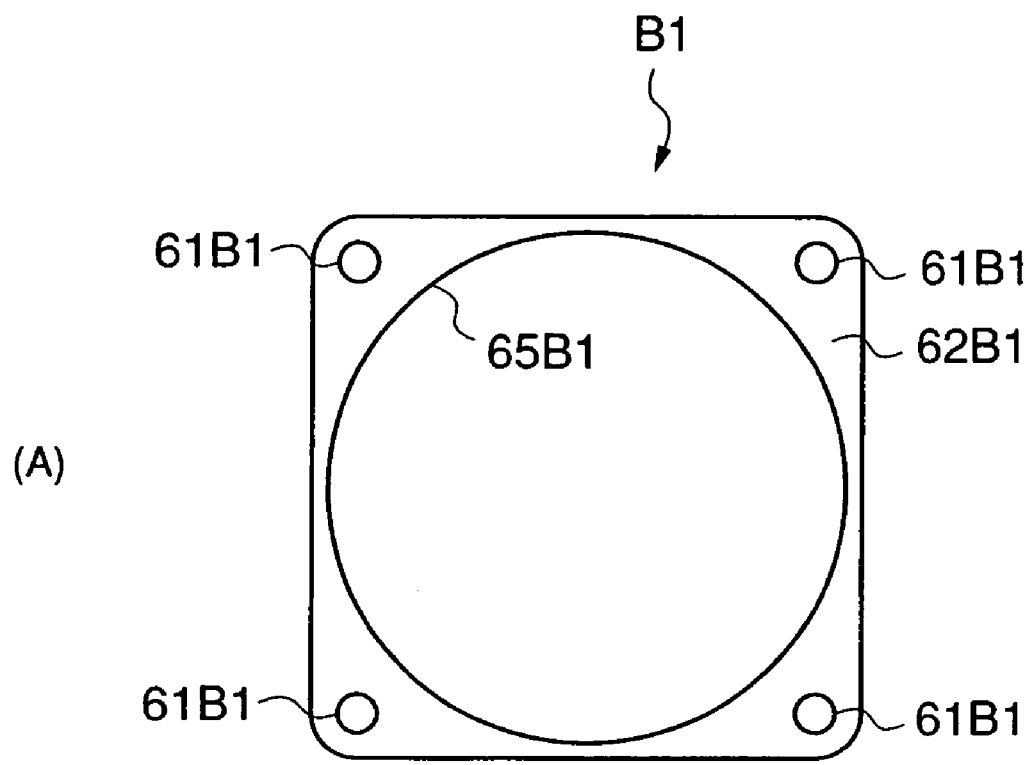
(A)
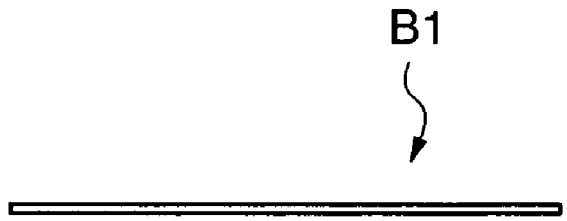
(B)

F I G.7
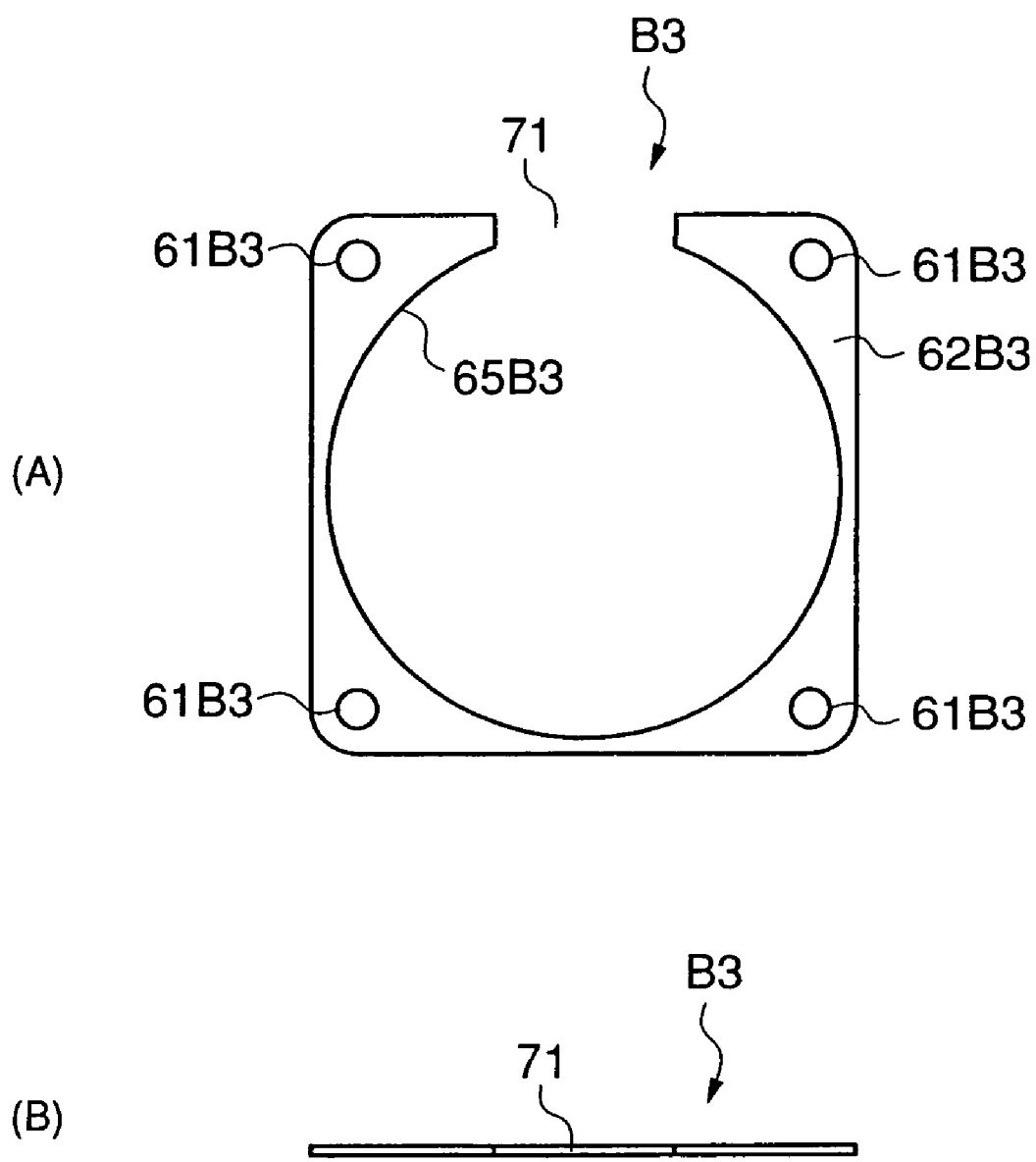

AXIAL FAN MOTOR WITH A LAMINATED CASING

CROSS-REFERENCE TO RELATED APPLICATIONS

The present application is a Division of U.S. application Ser. No. 10/040,470, filed Jan. 9, 2002 now U.S. Pat. No. 7,034,418, and claims priority of Japanese Application 2001-007125, filed Jan. 16, 2001.

BACKGROUND OF THE INVENTION

1. Field of the Invention

The present invention relates to an axial fan motor, and more particularly, to an axial fan motor for use in a cooling unit for air-cooling the heat sink of a heating element, such as a CPU, as well as to a cooling unit equipped with the axial fan motor.

2. Description of the Related Art

Conventionally, a heat sink is generally used in electronic equipment, such as a personal computer, in order to effectively release heat from a heating element, such as a CPU. In combination with the heat sink, an axial fan motor is used in order to forcibly cool the heat sink.

Since such an axial fan motor has a motor disposed at a central portion thereof, air flow exhausted from the central portion is of lower volume than air flow exhausted from a peripheral portion of the axial fan motor, with a resultant failure to uniformly cool the entire heat sink. Since air exhausted from the axial fan motor is of a whirl flow, cooling air fails to reach sufficiently deep into the heat sink along its cooling fins.

In order to compensate for any lack of cooling capability of an axial fan motor, an axial fan motor integrally equipped with air rectification blades is proposed in, for example, Japanese Application No. 2000-223696. The air rectification blades are intended to control air flow exhausted from the axial fan motor so as to produce uniform cooling air flow without whirls.

With recent increasing demands for reduction in size, weight, and cost of electronic equipment, release of heat from high integrated components has become a significant problem to solve.

SUMMARY OF THE INVENTION

An object of the present invention is to solve the above-mentioned problem in the conventional axial fan motor and to provide an axial fan motor capable of effectively and efficiently releasing heat from a heating element, such as a CPU, through application of a metallic material to a casing and air rectification blades, which are conventionally resin moldings, so as to utilize good heat conductivity of metal, to thereby facilitate compliance with demands for reduction in size, weight, and cost of electronic equipment, as well as to provide a cooling unit equipped with the axial fan motor.

To achieve the above object, the present invention provides an axial fan motor for a cooling unit, adapted to air-cool a heat sink of a heating element, such as a CPU, and thermally connected to the heat sink, which axial fan motor comprises a casing formed of a plurality of laminated metal plates.

Heat released from the heating element such as a CPU is conducted to the heat sink and is then carried away from the heat sink by means of cooling air which is caused to flow by the axial fan motor. Also, the heat is conducted through metal to the entire casing of the axial fan motor and is then carried away from the casing by means of the cooling air. Thus, the cooling efficiency of the heat sink is significantly enhanced. Therefore, the heat sink can assume a thin, flat form, thereby enabling a further reduction in size, weight, and cost of electronic equipment.

Since the casing of the axial fan motor is composed of a plurality of laminated metal plates, it is sufficient to provide metal plates and connection means (such as caulking, riveting, or welding). In contrast to a method of manufacturing a casing by die casting, which involves smoothing of a portion of a cast casing corresponding to mating surfaces of the dies, deburring, and dimensional finishing, the method according to the present invention permits to manufacture a casing without the involvement of such machining processes, thereby facilitating manufacture and enhancing productivity. Since metal plates of various shapes can be caulked together, a wide range of combinations of metal plates for lamination are available.

Preferably, the plurality of metal plates comprise a single first metal plate A and a plurality of second metal plates B. The single first metal plate A, which is an outermost layer located at the air exhaust side of a fan, comprises a peripheral portion having a circular inner edge; a central portion having a circular outer edge; and a plurality of arm portions for connecting the peripheral portion and the central portion. A bearing holder of a rotary shaft of the fan is attached to the central portion. The plurality of second metal plates B comprises, singly or in combination, the following metal plates B1, B2, and B3: (1) a metal plate B1 which includes only a peripheral portion having a circular inner edge; (2) a metal plate B2 which includes only a peripheral portion having a circular inner edge and assumes an outline of greater size than the outline of the metal plate B1; and (3) a metal plate B3 which includes only a peripheral portion having a circular inner edge and a single cutout portion formed in the peripheral portion and assumes an outline substantially equal in size to the outline of the metal plate B1.

The bearing holder supports a rotary portion of the axial fan motor via a bearing, and a stationary portion (stator) of the axial fan motor is fixedly attached to the bearing holder, whereby the main body (the stationary portion and the rotary portion) of the axial fan motor is fixedly attached to the casing. In this manner, the assembly of the axial fan motor is simplified. Through appropriate combination of the metal plates B1 to B3, the efficiency of releasing heat from the casing can be enhanced to thereby enhance the cooling efficiency of the heat sink.

Preferably, all of the plurality of second metal plates B are the metal plates B1. Since metal plates of merely a single kind; i.e., merely the metal plates B1, are used as the second metal plates B, manufacture of the casing is significantly facilitated.

Preferably, all of the plurality of second metal plates B are the metal plates B3. Since metal plates of merely a single kind; i.e., merely the metal plates B3, are used as the second metal plates B, manufacture of the casing is significantly facilitated. Since cooling air flows between the interior of the casing and the exterior of the casing through the cutout portions of the metal plates B3, the efficiency of releasing heat from the casing is further enhanced to thereby further enhance the cooling efficiency of the heat sink.

Preferably, the metal plates B3 are arranged such that the angular positions of the cutout portions of the metal plates B3 are successively shifted in the same circumferential direction and such that a phase shift of a predetermined angle is produced between two adjacent cutout portions. Since cooling air flows between the interior of the casing and the exterior of the casing through the cutout portions of the metal plates B3 which are circumferentially arranged at predetermined intervals, heat can be uniformly released from the casing to thereby lessen thermal stress in the casing. Thus, the durability of the casing can be enhanced.

Preferably, the plurality of second metal plates B comprise the metal plates B1 and B2 such that the metal plates B1 and B2 are laminated alternately. Since peripheral edge portions of the metal plates B2 which project beyond the peripheral edges of the metal plates B1 serve as fins, the efficiency of releasing heat from the casing is further enhanced to thereby further enhance the cooling efficiency of the heat sink.

Preferably, the plurality of second metal plates B comprise the metal plates B2 and B3 such that the metal plates B2 and B3 are laminated alternately. Since peripheral edge portions of the metal plates B2 which project beyond the peripheral edges of the metal plates B3 serve as fins, and cooling air flows between the interior of the casing and the exterior of the casing through the cutout portions of the metal plates B3, the efficiency of releasing heat from the casing is greatly enhanced to thereby greatly enhance the cooling efficiency of the heat sink.

Preferably, the metal plates B2 and B3 are arranged alternately such that the angular positions of the cutout portions of the metal plates B3 are successively shifted in the same circumferential direction and such that a phase shift of a predetermined angle is produced between two adjacent cutout portions. Since cooling air flows between the interior of the casing and the exterior of the casing through the cutout portions of the metal plates B3 which are circumferentially arranged at predetermined intervals, heat can be uniformly released from the casing to thereby lessen thermal stress in the casing. Thus, the durability of the casing can be enhanced.

Preferably, the first metal plate A and the bearing holder are integrally formed of the same metal. This structural feature simplifies assembly of the casing and the main body (the stationary portion and the rotary portion) of the axial fan motor to thereby further simplify the assembled structure of the axial fan motor. Since the bearing holder is made of metal, release of heat from a bearing portion is accelerated to thereby eliminate an adverse effect of heat on a bearing.

The present invention further provides an axial fan motor for a cooling unit, adapted to air-cool a heat sink of a heating element, such as a CPU, and thermally connected to the heat sink, which axial fan motor comprises a casing formed of a plurality of metal plates and a single or a plurality of resin plates arranged in layers.

Since a resin plate(s) partially constitutes the casing, the cooling efficiency of the heat sink drops slightly as compared with the casing formed of metal plates only. However, the weight and cost of the casing drop, to thereby enable a further reduction in weight and cost of electronic equipment. Since the casing can be manufactured from a plurality of metal plates, a single or a plurality of resin plates, and connection means, the following effect is yielded. In contrast to a method of manufacturing a casing by die casting, which involves smoothing of a portion of a cast casing corresponding to mating surfaces of the dies, deburring, and dimensional finishing, the method according to the present invention permits to manufacture a casing without the involvement of such machining processes, thereby facilitating manufacture and enhancing productivity.

Preferably, the single or plurality of resin plates comprise at least a single resin plate C, which is an outermost layer located at an air exhaust side of a fan. The resin plate C comprises a peripheral portion having a circular inner edge; a central portion having a circular outer edge; and a plurality of arm portions for connecting the peripheral portion and the central portion. A bearing holder of a rotary shaft of the fan is attached to the central portion.

The bearing holder supports a rotary portion of the axial fan motor via a bearing, and a stationary portion of the axial fan motor is fixedly attached to the bearing holder, whereby the main body (the stationary portion and the rotary portion) of the axial fan motor is attached to the casing. In this manner, the assembled structure of the axial fan motor is simplified.

Preferably, the resin plate C and the bearing holder are integrally formed of the same resin. This structural feature simplifies assembly of the casing and the main body (the stationary portion and the rotary portion) of the axial fan motor to thereby further simplify the assembled structure of the axial fan motor.

Preferably, the predetermined angle is 90 degrees. Every time four metal plates B3 are laminated, the cutout portions of the metal plates B3 are arranged all around the casing. Thus, heat can be further uniformly released from the casing to thereby further lessen thermal stress in the casing. Thus, the durability of the casing can further be enhanced.

Preferably, one of the arm portions has a window formed therein so as to allow looking therethrough at least at a terminal of a lead wire, and holder means for holding a lead wire. As a result, the lead wire terminal and a motor winding terminal can be connected while looking through the window. Thus, the connection work is facilitated; lead wires can be efficiently run; and the appearance of the product is improved.

Preferably, the axial fan motor further comprises an air rectification means. The air rectification means straightens cooling air which is caused to flow by the axial fan motor, whereby the cooling air can reach deep into the heat sink along its fins without involvement of whirls to thereby further enhance the cooling efficiency of the heat sink.

Preferably, the air rectification means is disposed between the axial fan motor and the heat sink and assumes the form of a air rectification cylinder equipped with a plurality of air rectification blades. As a result, an adverse effect which the motor portion located at the central portion of the fan motor causes to the flow of cooling air is alleviated, thereby suppressing a phenomenon that an air flow rate at a central portion of the axial fan motor becomes lower than that at a peripheral portion of the axial fan motor. The cooling air can reach deep into the heat sink to thereby further uniformly cool the heat sink. Thus, the cooling efficiency of the heat sink can further be enhanced.

The present invention still further provides a cooling unit comprising an axial fan motor of the present invention and a shroud for mounting the axial fan motor above a heat sink. The shroud comprises a support base having a central portion cut out and on which a casing of the axial fan motor is mounted; and a plurality of legs extending downward from a plurality of positions on a peripheral edge of the support base. The support base covers and is thermally connected to the heat sink, and end portions of the legs are engaged with a base of the heat sink, whereby the shroud is fixedly attached to the heat sink. The shroud and a plate serving as an outermost layer located at the air intake side of the fan of the axial fan motor and partially constituting the casing of the axial fan motor are integrally formed of the same material.

Since the shroud and a single plate which is one of the layers constituting the casing of the axial fan motor and is an outermost layer located at the air intake side of the fan are integrally formed of the same material, the shroud and the casing can be readily assembled. Thus, the axial fan motor can be readily mounted above the heat sink.

BRIEF DESCRIPTION OF THE DRAWINGS

FIG. 4A is a plan view of a first metal plate A, which is one of layers constituting the casing of the axial fan motor according to the first embodiment;

FIG. 4B is a side view of the first metal plate A of FIG. 4A;

FIG. 4C is a sectional view taken along line C—C of FIG. 4A;

FIG. 5A is a plan view of a metal plate B1 which is a kind of second metal plate B and is one of the layers constituting the casing of the axial fan motor according to the first embodiment;

FIG. 5B is a side view of the metal plate B1 of FIG. 5A;

FIG. 7A is a plan view of a metal plate B3 which is a kind of second metal plate B and is one of layers constituting the casing of an axial fan motor according to a second embodiment of the present invention;

FIG. 7B is a side view of the metal plate B3 of FIG. 7A;

DESCRIPTION OF THE PREFERRED EMBODIMENTS

A first embodiment of the present invention will next be described in detail with reference to FIGS. 1 to 5 and 8 and 9.

Figure 1:
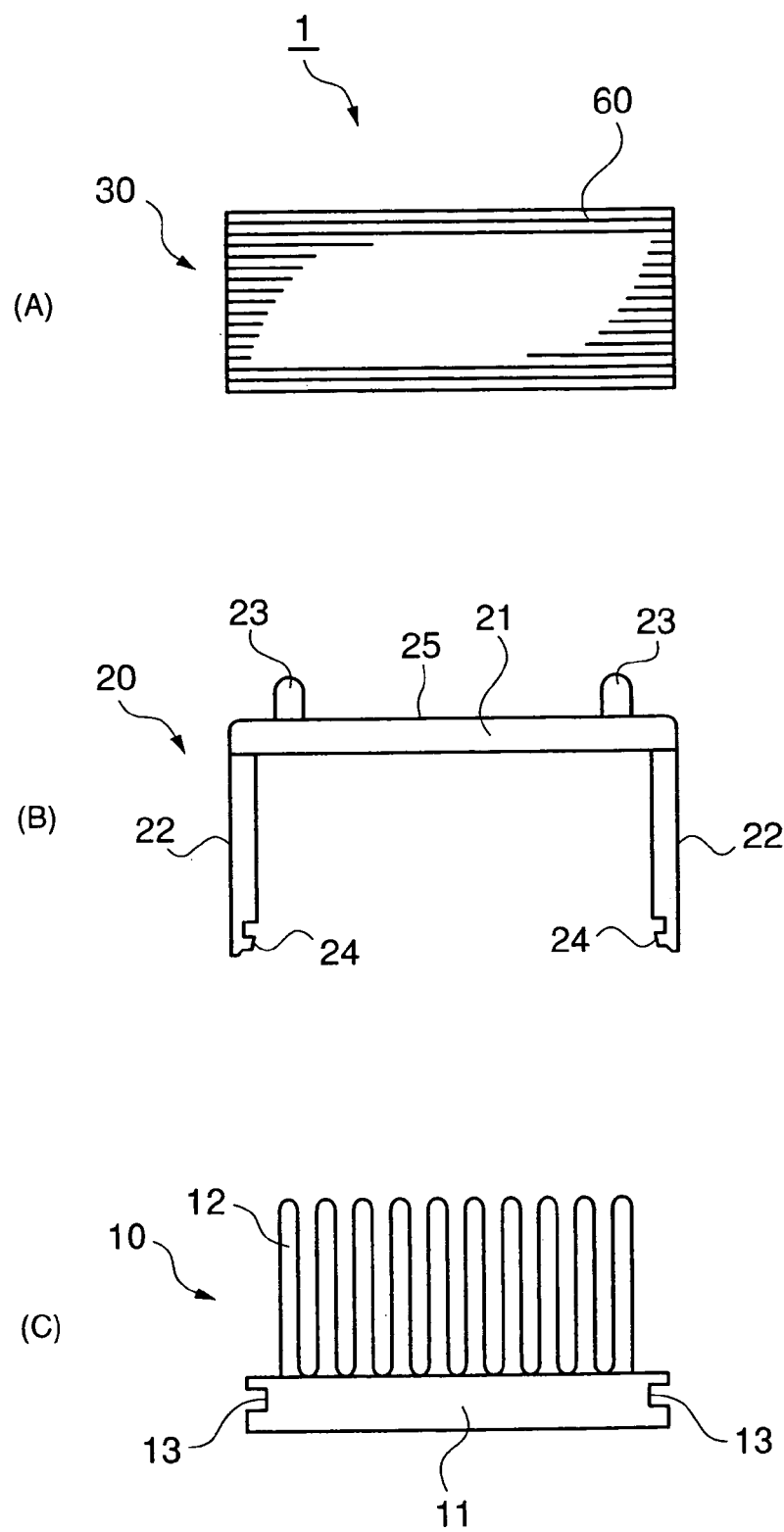
FIGS. 1A, 1B, and 1C are exploded views of a cooling unit equipped with an axial fan motor according to a first embodiment of the present invention.
Figure 2:
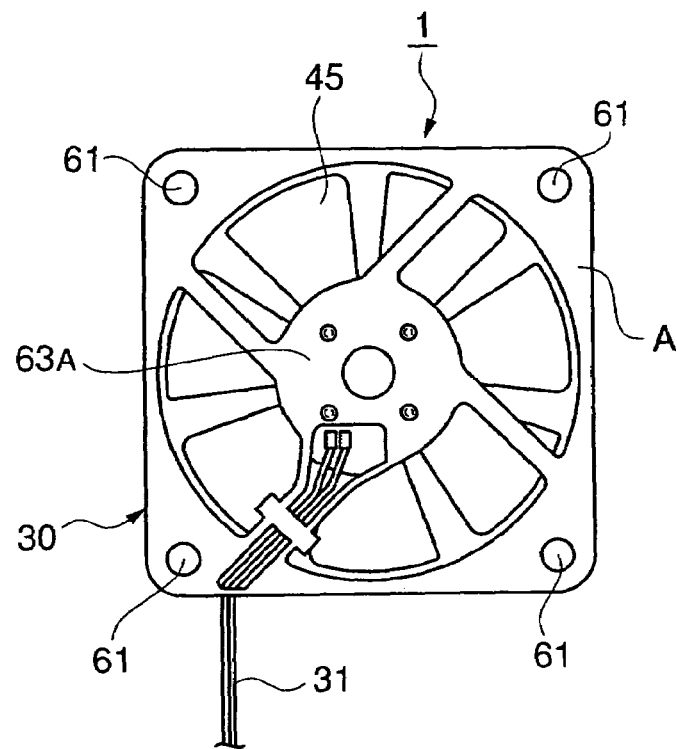
FIG. 2 is a plan view of the cooling unit of FIG. 1.
Figure 3:
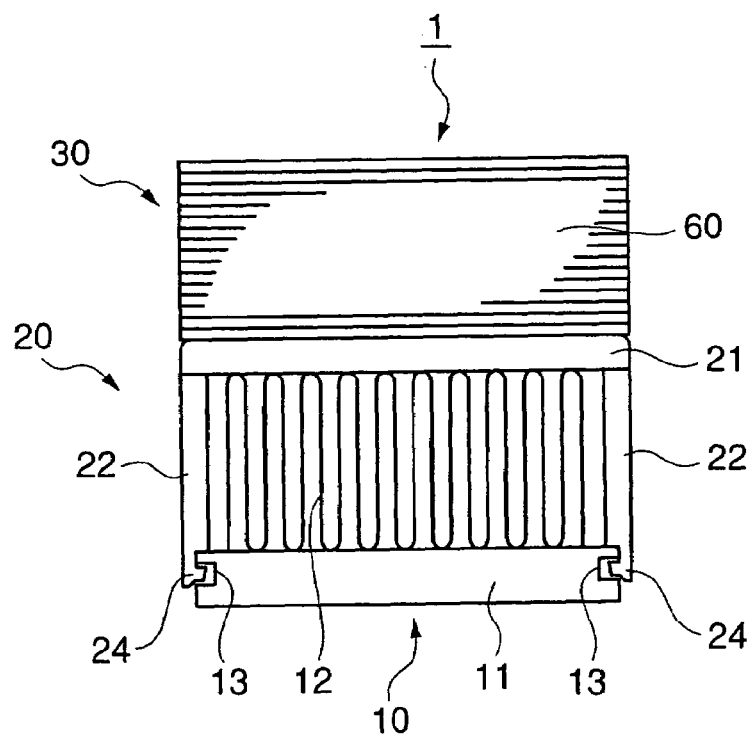
FIG. 3 is a side view of the cooling unit of FIG. 1.

A cooling unit equipped with an axial fan motor according to the first embodiment of the present invention is used to cool a heating element, such as a CPU. As shown in FIGS. 1A to 1C, the cooling unit 1 includes a heat sink 10 (FIG. 1C); an axial fan motor 30 (FIG. 1A) for air-cooling the heat sink 10; and a shroud 20 (FIG. 1B) serving as a stand for mounting the axial fan motor 30 above the heat sink 10. FIGS. 2 and 3 show the assembled cooling unit 1.

The heat sink 10 includes a base 11, which is a square metal plate of good heat conductivity having a certain thickness, and fins 12 fixedly mounted on the base 11. A package (not shown) of a heating element, such as a CPU, is in contact with the side of the base 11 opposite the fin side. Heat is conducted from the package to the base 11 and then to the fins 12, from which the heat is released. In this manner, temperature rise within the package is suppressed to thereby ensure proper operation of the heating element.

Engagement recesses 13 are formed on side walls of the square base 11 in the vicinity of four corners in order to receive engagement hooks 24 formed at ends of legs 22, which will be described later, of the shroud 20. When the shroud 20 is engaged with the heat sink 10, the legs 22 extend downward outside the fins 12 of the heat sink 10.

The shroud 20 includes a support base 21 and four legs 22, which extend downward from four corners of the support base 21. As viewed from above, the support base 21 assumes a square shape similar to that of the base 11. A central portion (not shown) of the support base 21, which has a diameter substantially similar to the outer diameter of a wheel of blades 45, which will be described later, is cut out. The support base 21 has a mounting surface 25 on which a casing 60 (see FIGS. 8 and 9) of the axial fan motor 30 is mounted in a fixed condition.

Four protrusions 23 are provided on the mounting surface 25 of the support base 21 of the shroud 20 in the vicinity of the corresponding four corners of the support base 21. The protrusions 23 are fitted into corresponding engagement holes 61, which will be described later, formed in the casing 60 in the vicinity of four corners, thereby fixedly mounting the axial fan motor 30 in place on the shroud 20. In this state, the casing 60 is thermally connected to the support base 21. The expression "thermally connected" means that two members are connected such that heat can be conducted therebetween.

The engagement hooks 24 formed at the corresponding ends of the legs 22 of the shroud 20 are engaged with the corresponding engagement recesses 13 formed in the base 11, whereby the shroud 20 is fixedly attached to the heat sink 10 in such a manner as to cover the heat sink 10. As a result, the support base 21 of the shroud 20 abuts the tops of the fins 12 of the heat sink 10 to thereby establish thermal connection therebetween. Heat of the heat sink 10 is conducted to the shroud 20 and then to the casing 60. Preferably, the shroud 20 is an integral product made of a metal of good thermal conductivity. However, the shroud 20 can be a resin molding.

Next, the structure of the axial fan motor 30 will be described in detail.

Figure 8:
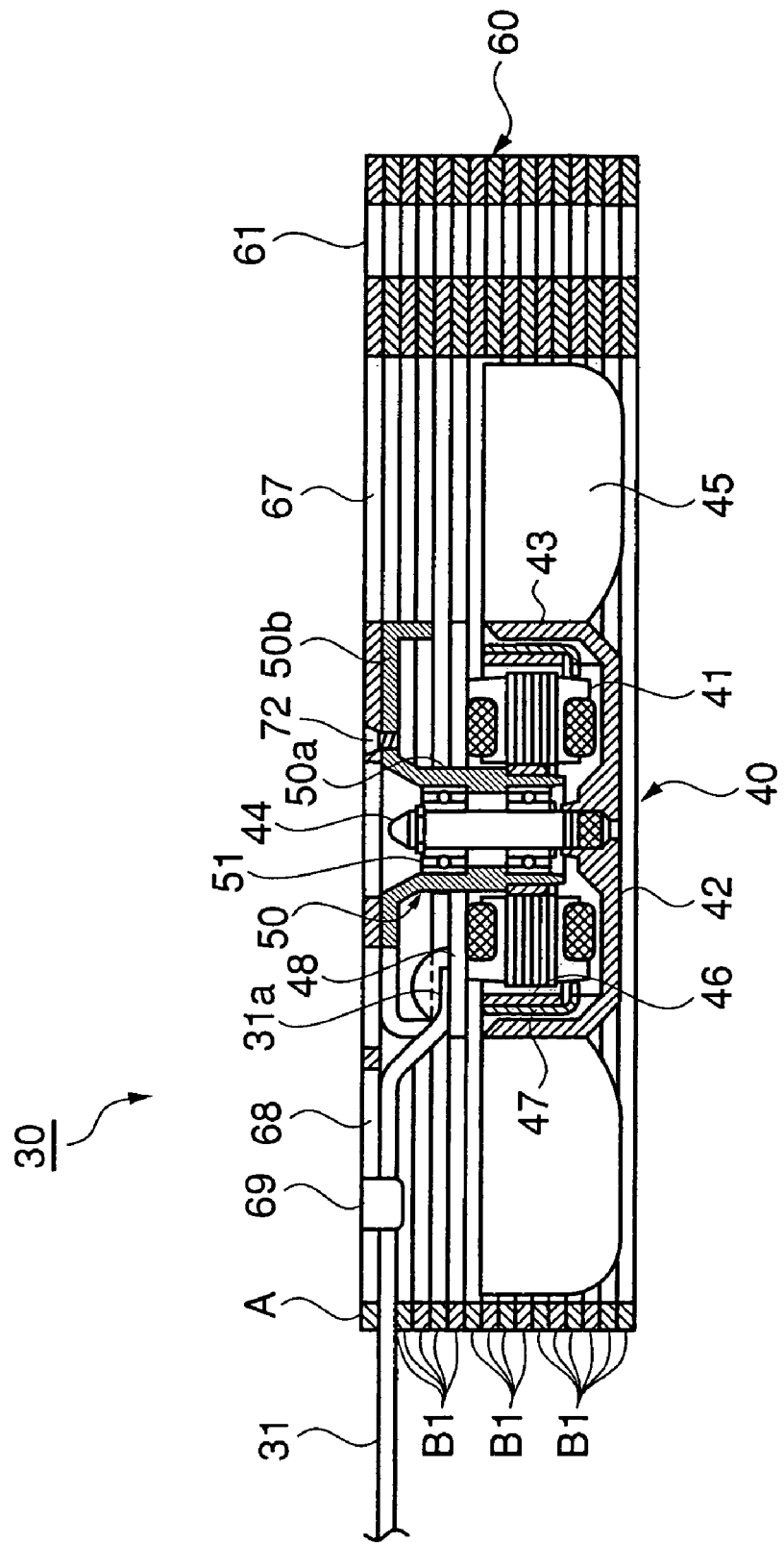
FIG. 8 is a sectional view of the axial fan motor according to the first embodiment, taken along line VIII—VIII of FIG. 9.
Figure 9:
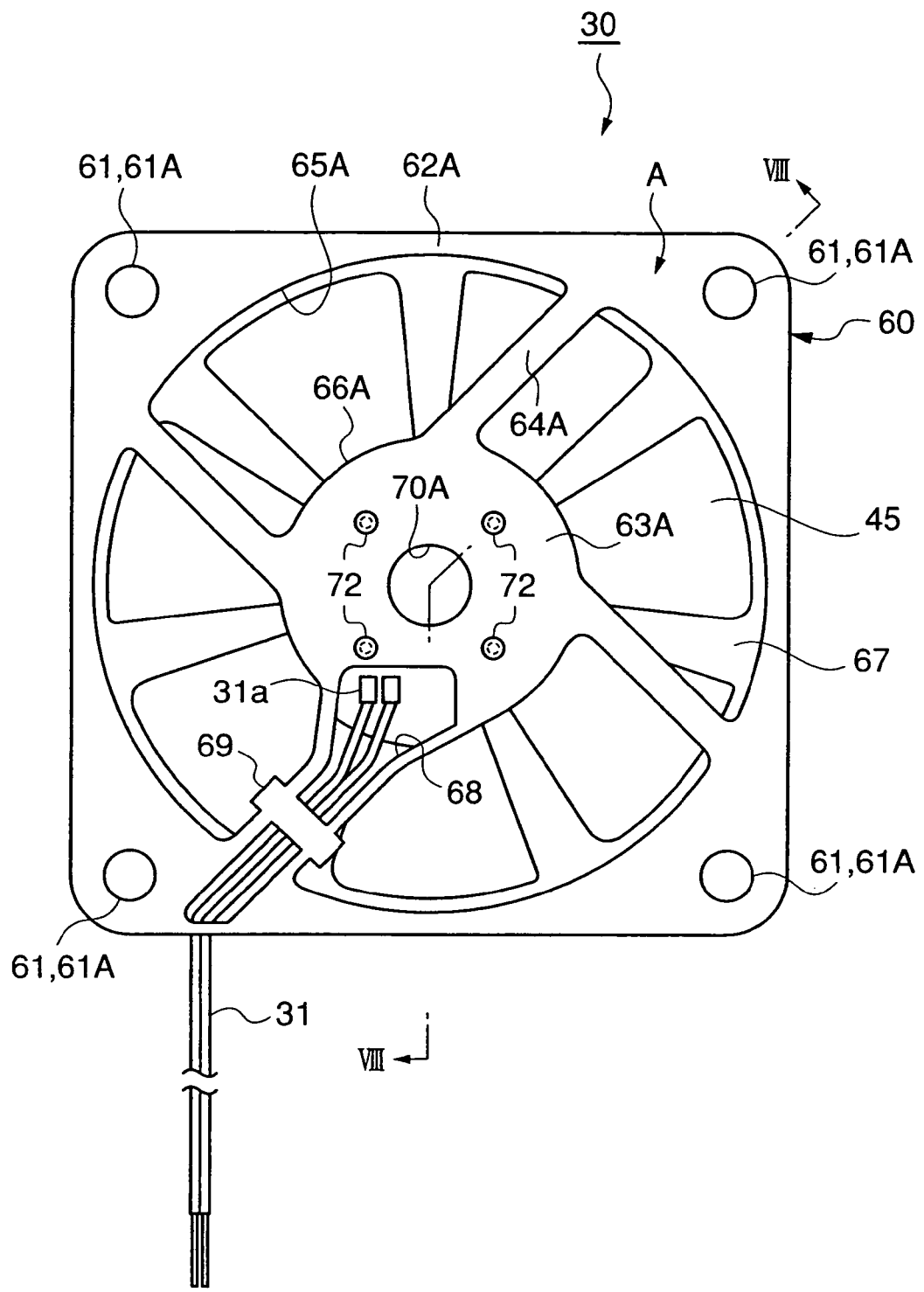
FIG. 9 is a plan view of the axial fan motor according to the first embodiment.

As shown in FIGS. 8 and 9, the axial fan motor 30 includes a main body 40; the casing 60, which encloses the main body 40; and a bearing holder 50, which is located between the main body 40 and the casing 60 and is adapted to fixedly connect the main body 40 and the casing 60.

The main body 40 includes a motor and rotary blades; i.e., a stationary portion 41 and a rotary portion (a rotor with blades) 42.

The stationary portion 41 is configured in the following manner. A stator core is fitted to an end part of a cylindrical portion 50a of the bearing holder 50. The bearing holder 50 is fixedly connected to the casing 60. A PCB (Printed Circuit Board) 48 is located at an upper portion of the stationary portion 41 in such a manner as to be fitted to the cylindrical portion 50a of the bearing holder 50. On the PCB 48, terminals 31a of lead wires 31 and terminals of windings of the stationary portion 41, which serves as a stator of the motor, are soldered.

The rotary portion 42 is configured in the following manner. A rotary shaft 44 stands at the center of the bottom of a bottomed rotary cylinder 43. The rotary shaft 44 is rotatably supported by the cylindrical portion 50a of the bearing holder 50 via a pair of ball bearings 51. Pairs each consisting of a permanent magnet 46 and a yoke 47 are circumferentially arranged at equal intervals along the inner circumferential wall of the bottomed rotary cylinder 43. The permanent magnets 46 and the yokes 47 arranged in pairs and the bottomed rotary cylinder 43 constitute a rotor of the motor. A number of blades 45 are attached to the outer circumferential wall of the bottomed rotary cylinder 43. The bottomed rotary cylinder 43 and the blades 45 are usually formed into a unitary body through resin molding.

The bearing holder 50 is fixedly attached to the casing 60 such that a flange portion 50b extending from the upper base end of the cylindrical portion 50a is fixedly attached onto a central portion 63A of a first metal plate A, which will be described later, of the casing 60 by use of four screws 72. In this manner, the main body 40 (stationary portion 41 and rotary portion 42) is supported by and attached to the casing 60 to thereby form the axial fan motor 30. The bearing holder 50 is made of metal.

The casing 60 is composed of a plurality of laminated metal plates.

The plurality of metal plates include a single first metal plate A, which is the outermost layer located at the air exhaust side of a fan, and a plurality of remaining second metal plates B. The term "fan" denotes a structural feature of the axial fan motor 30 which serves as a fan (excluding motor-related structural features, such as the stationary portion 41, the permanent magnets 46, and the yokes 47).

As shown in FIGS. 4 and 9, the first metal plate A includes a peripheral portion 62A having a circular inner edge 65A; a central portion 63A having a circular outer edge 66A; and a plurality of (4) arm portions 64A which connect the peripheral portion 62A and the central portion 63A. The metal plate A has four circular holes 61A formed in the vicinity of the corresponding four corners thereof. The circular holes 61A serve as the corresponding engagement holes 61 formed in the casing 60 in the vicinity of the corresponding four corners thereof.

The peripheral portion 62A has an outline, as viewed from above, similar to those of the base 11 and the support base 21 of the shroud 20. As mentioned previously, the flange portion 50b of the bearing holder 50 is fixedly attached to the central portion 63A by use of the screws 72. The circular inner edge 65A of the peripheral portion 62A and the circular outer edge 66A of the central portion 63A define a fan exhaust port 67.

A window 68 is formed through blanking in a single arm portion 64A so that the lead wires 31 and the terminals 31a can be seen therethrough. The window 68 extends to the peripheral portion 62A and extends to the central portion 63A such that the size thereof is expanded so as to facilitate soldering of the terminals 31a and terminals of motor windings. Holder means 69 for holding the lead wires 31 is provided at the substantially lengthwise center of the window 68. The holder means 69 is formed integral with the corresponding arm portion 64A in the process of forming the metal plate A through blanking, such that opposite ends project into the exhaust port 67. The opposite ends are bent so as to assume a substantially box-like form as shown in FIG. 4C.

According to the first embodiment, a plurality of second metal plates B each assume the form of a metal plate B1 shown in FIG. 5.

The metal plate B1 has an outline equal in size to the outline of the first metal plate A and is merely composed of a peripheral portion 62B1 having a circular inner edge 65B1. That is, in contrast to the first metal plate A, the metal plate B1 does not have a central portion and arm portions for connecting the central portion and the peripheral portion 62B1. The metal plate B1 has four circular holes 61B1 formed in the vicinity of the corresponding four corners thereof. The circular holes 61B1 serve as the corresponding engagement holes 61 formed in the casing 60 in the vicinity of the corresponding four corners thereof.

The first metal plate A and a plurality of second metal plates B1 are laminated such that the first metal plate A becomes the outermost layer located at the air exhaust side of the fan. Accordingly, the second metal plates B1 are arranged underneath the first metal plate A. The layered metal plates A and B1 are integrally laminated by caulking. Other methods for integrally laminating the metal plates A and B1 include the following: riveting by use of rivets inserted through corresponding rivet holes which are formed in the vicinity of the engagement holes 61 (circular holes 61A and 61B1); bolting; bonding; and peripheral welding.

Next, the operation of the thus-configured cooling unit 1 will be described.

When the rotary portion 42 of the axial fan motor 30 starts rotating as a result of energization of the axial fan motor 30, the axial fan motor 30 takes cooling air into the heat sink 10 from around the heat sink 10. The cooling air enters deep into the heat sink 10 to thereby take heat from the fins 12. Then, the cooling air flows through a central hollow portion of the shroud 20 and the interior of the casing 60 and is then exhausted from the exhaust port 67.

Since the shroud 20 is interposed between the axial fan motor 30 and the heat sink 10 to thereby establish a certain distance therebetween, there is suppressed an adverse effect of the main body 40 of the axial fan motor 30 on deep entry of cooling air into the heat sink 10. Flowing through the central hollow portion of the shroud 20 and the interior of the casing 60, the cooling air also takes heat from the shroud 20 and the casing 60 to thereby effectively cool the heat sink 10 in two stages.

The first embodiment, which is configured and operates as mentioned above, yields the following effects.

The axial fan motor 30, which is adapted to air-cool the heat sink 10 of a heating element, such as a CPU, and is thermally connected to the heat sink 10, includes the casing 60 which, in turn, includes a plurality of laminated metal plates. Thus, heat released from the heating element, such as a CPU, is conducted to the heat sink 10 and is then carried away from the heat sink 10 by means of cooling air which is caused to flow by the axial fan motor 30. Also, the heat is conducted through the shroud 20 made of a metal to the entire casing 60 of the axial fan motor 30 and is then carried away from the casing 60 by means of the cooling air which is caused to flow by the axial fan motor 30. Thus, the cooling efficiency of the heat sink 10 is significantly enhanced. Therefore, the heat sink 10 can assume a thin, flat form, thereby enabling a further reduction in size, weight, and cost of electronic equipment.

Since the casing 60 of the axial fan motor 30 is composed of a plurality of laminated metal plates, the casing 60 can be manufactured by use of the metal plates and connection means (such as caulking, riveting, or welding). In contrast to the casing 60 manufactured by die casting, which involves smoothing of a portion of a cast casing corresponding to mating surfaces of the dies, deburring, and dimensional finishing, the casing 60 can be manufactured without the involvement of such machining processes, thereby facilitating manufacture and enhancing productivity.

The plurality of metal plates is composed of a single first metal plate A and a plurality of second metal plates B. The single first metal plate A, which is the outermost layer located at the air exhaust side of a fan, includes the peripheral portion 62A having the circular inner edge 65A; the central portion 63A having the circular outer edge 66A; and a plurality of arm portions 64A for connecting the peripheral portion 62A and the central portion 63A. The bearing holder 50 of the rotary shaft 44 of the fan (i.e., the rotary shaft 44 of the axial fan motor 30) is attached to the central portion 63A. All of the plurality of second metal plates B are the metal plates B1, each of which is composed of the peripheral portion 62B1 having the circular inner edge 65B1. The bearing holder 50 supports the rotary portion (the rotor with blades) 42 of the axial fan motor 30 via a bearing, and the stationary portion 41 of the axial fan motor 30 is fixedly attached to the bearing holder 50, whereby the main body 40 (the stationary portion 41 and the rotary portion 42) of the axial fan motor 30 is attached to the casing 60. In this manner, the assembled structure of the axial fan motor 30 is simplified. Since metal plates of merely a single kind; i.e., merely the metal plates B1, are used as the second metal plates B, manufacture of the casing 60 is significantly facilitated.

One of the arm portions 64A has the window 68 formed therein to allow looking therethrough at least at the terminals 31a of the lead wires 31, and the holder means 69 for holding the lead wires 31. The lead wire terminals 31a and corresponding motor winding terminals can be connected while looking through the window 68. Thus, the connection work is facilitated; the lead wires 31 can be efficiently run; and the appearance of the product is improved.

Since the bearing holder 50 is made of metal, release of heat from the bearing portion of the rotary portion 42 of the axial fan motor 30 is accelerated to thereby eliminate an adverse effect of heat on the ball bearings 51.

Figure 10:
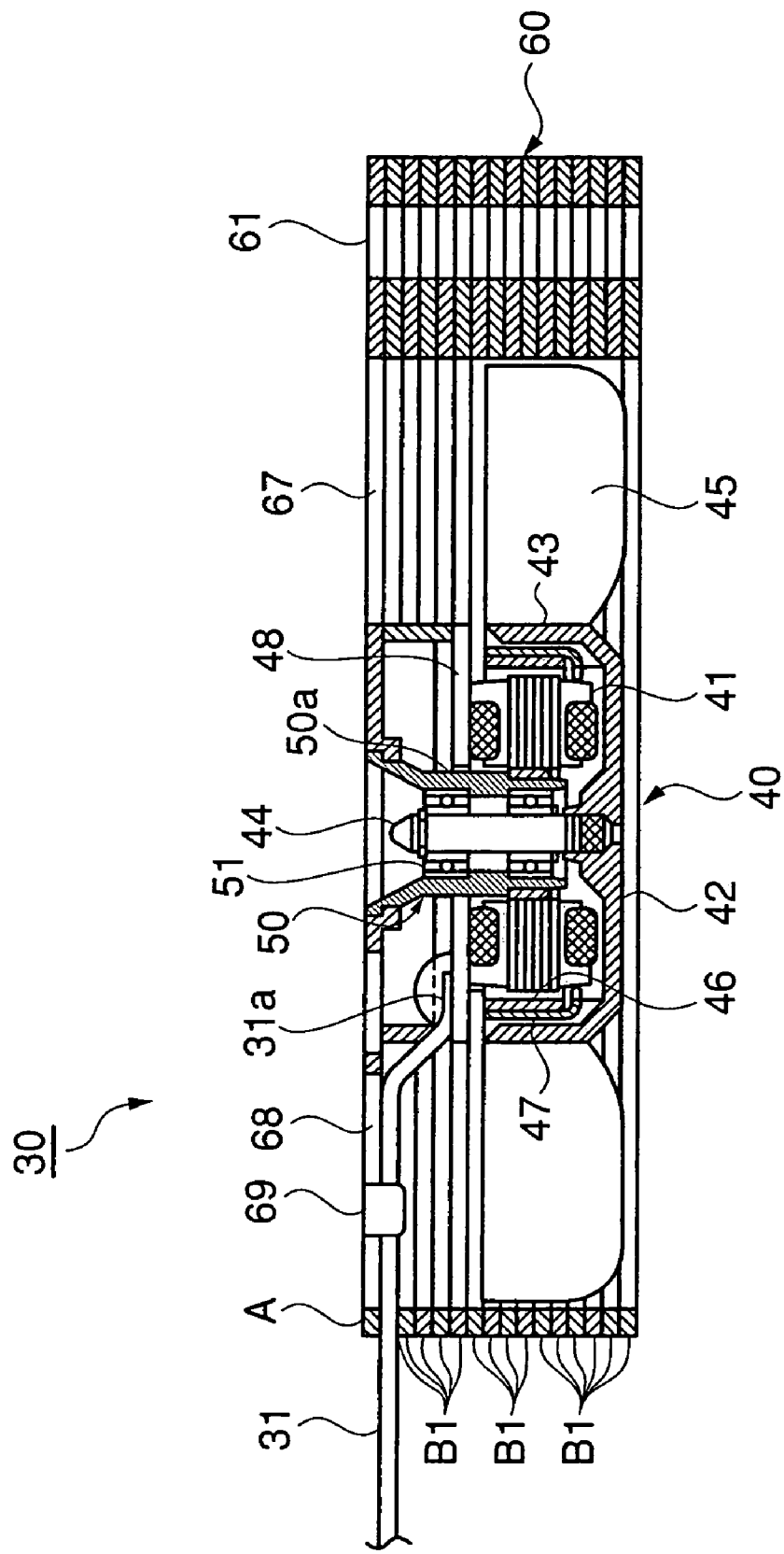
FIG. 10 is a sectional view corresponding to FIG. 8 and showing a modification of the first embodiment.
Figure 11:
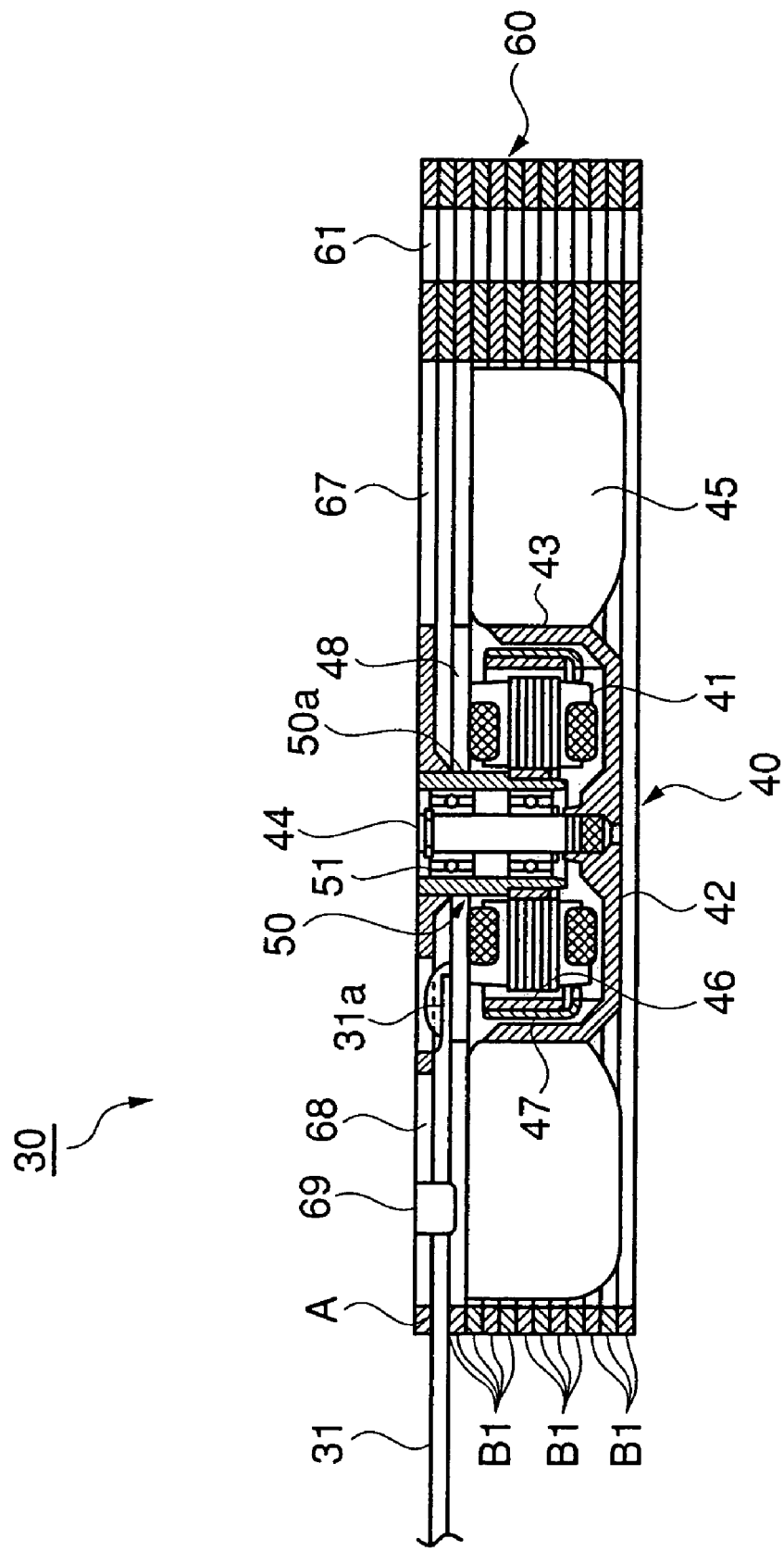
FIG. 11 is a sectional view corresponding to FIG. 8 and showing another modification of the first embodiment.

According to the first embodiment, the bearing holder 50 is fixedly attached to the casing 60 such that the flange portion 50b extending from the upper base end of the cylindrical portion 50a is fixedly attached onto the central portion 63A of the first metal plate A of the casing 60 by use of the screws 72. However, the present invention is not limited thereto. The following structural features may be employed instead. As shown in FIG. 10, the bearing holder 50 does not have the flange portion 50b. An upper base end part of the cylindrical portion 50a of the bearing holder 50 is engaged with a circular inner edge 70A (see FIG. 9) of the central portion 63A of the first metal plate A through, as an example, stepped-edge-to-stepped-edge engagement, to thereby fixedly engage the bearing holder 50 with the casing 60. Alternatively, as shown in FIG. 11, an upper base end part of the cylindrical portion 50a is press-fitted into the circular inner edge 70A, followed by bonding or caulking to thereby fixedly engage the bearing holder 50 with the casing 60. This method can fixedly engage the bearing holder 50 with the casing 60 at relatively low cost.

Figure 12:
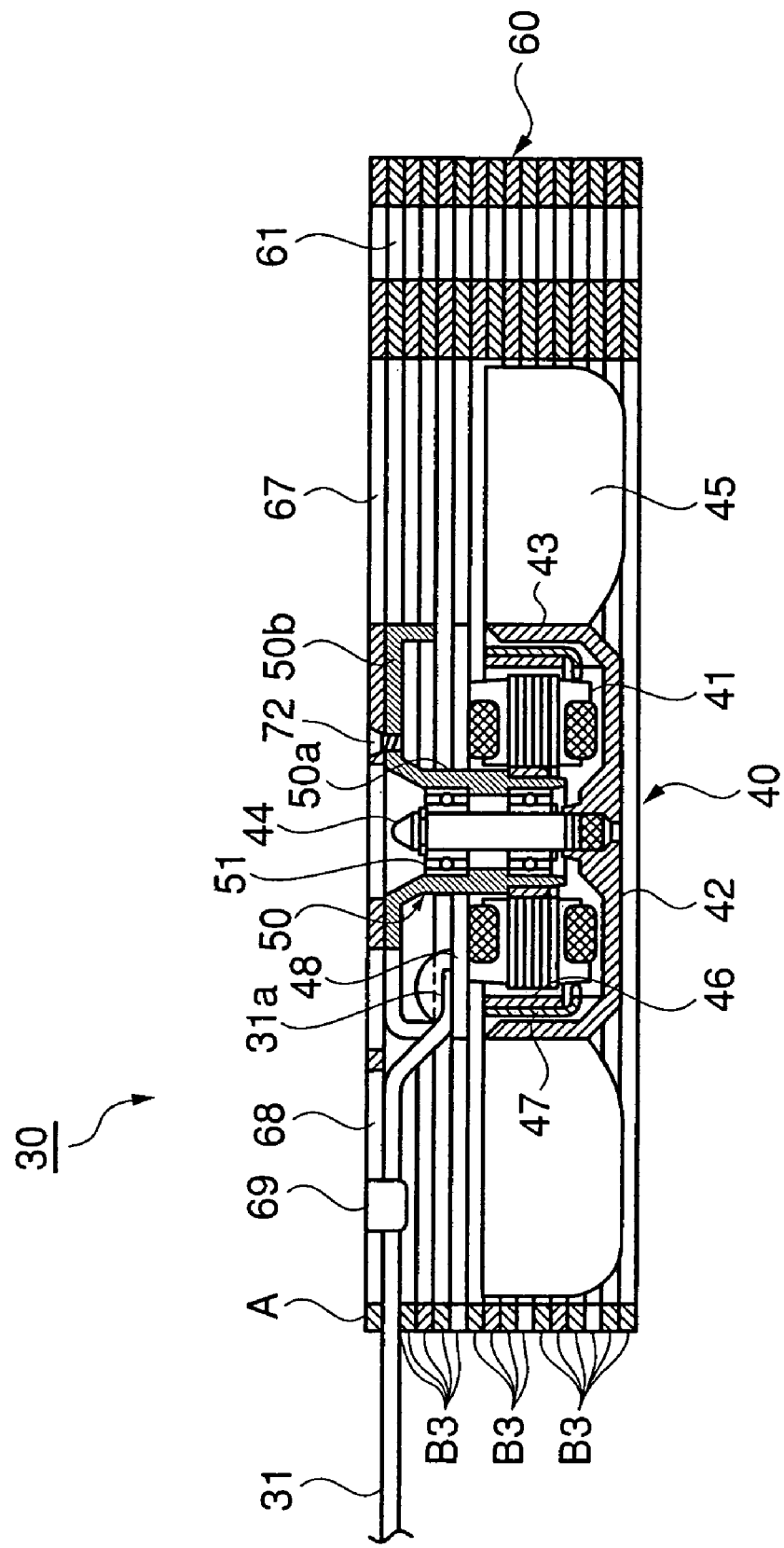
FIG. 12 is a sectional view corresponding to FIG. 8 and showing an axial fan motor according to a second embodiment which employs a casing formed through use of the metal plates B3 of FIG. 7.

Next, a second embodiment of the present invention will be described in detail with reference to FIGS. 7 and 12.

FIG. 7 shows a metal plate B3 which is a kind of second metal plate B and is one of layers constituting the casing of an axial fan motor according to the second embodiment. FIG. 7A is a plan view of the metal plate B3, and FIG. 7B is a side view of the metal plate B3. FIG. 12 is a sectional view of the axial fan motor according to the second embodiment which employs the casing formed through use of the metal plates B3, and corresponds to FIG. 8, which shows the axial fan motor according to the first embodiment. Structural features similar to those of the first embodiment are denoted by common reference numerals.

The casing 60 of the axial fan motor 30 of the second embodiment is composed of a single first metal plate A, which is the outermost layer located at the air exhaust side of a fan, and a plurality of second metal plates B. All of the second metal plates B are the metal plates B3 shown in FIG. 7.

As shown in FIG. 7, the metal plate B3 includes a peripheral portion 62B3 having a circular inner edge 65B3 and a single cutout portion 71 formed through the peripheral portion 62B3 being partially cut off and assumes an outline equal in size to the outline of the metal plate B1. The cutout portion 71 is formed at one side of the square shape of the metal plate B3. As shown in FIG. 12, a plurality of metal plates B3 are laminated underneath the first metal plate A to thereby constitute the casing 60.

The metal plates B3 are laminated such that the angular positions of the cutout portions 71 of the metal plates B3 are successively shifted in the same circumferential direction and such that a phase shift of a predetermined angle 90 degrees is produced between two adjacent cutout portions 71. Thus, every time four metal plates B3 are laminated, the cutout portions 71 of the metal plates B3 are arranged all around the casing. The cutout portion 71 of the metal plate B3 appears at the same position every five metal plates B3.

Figure 13:
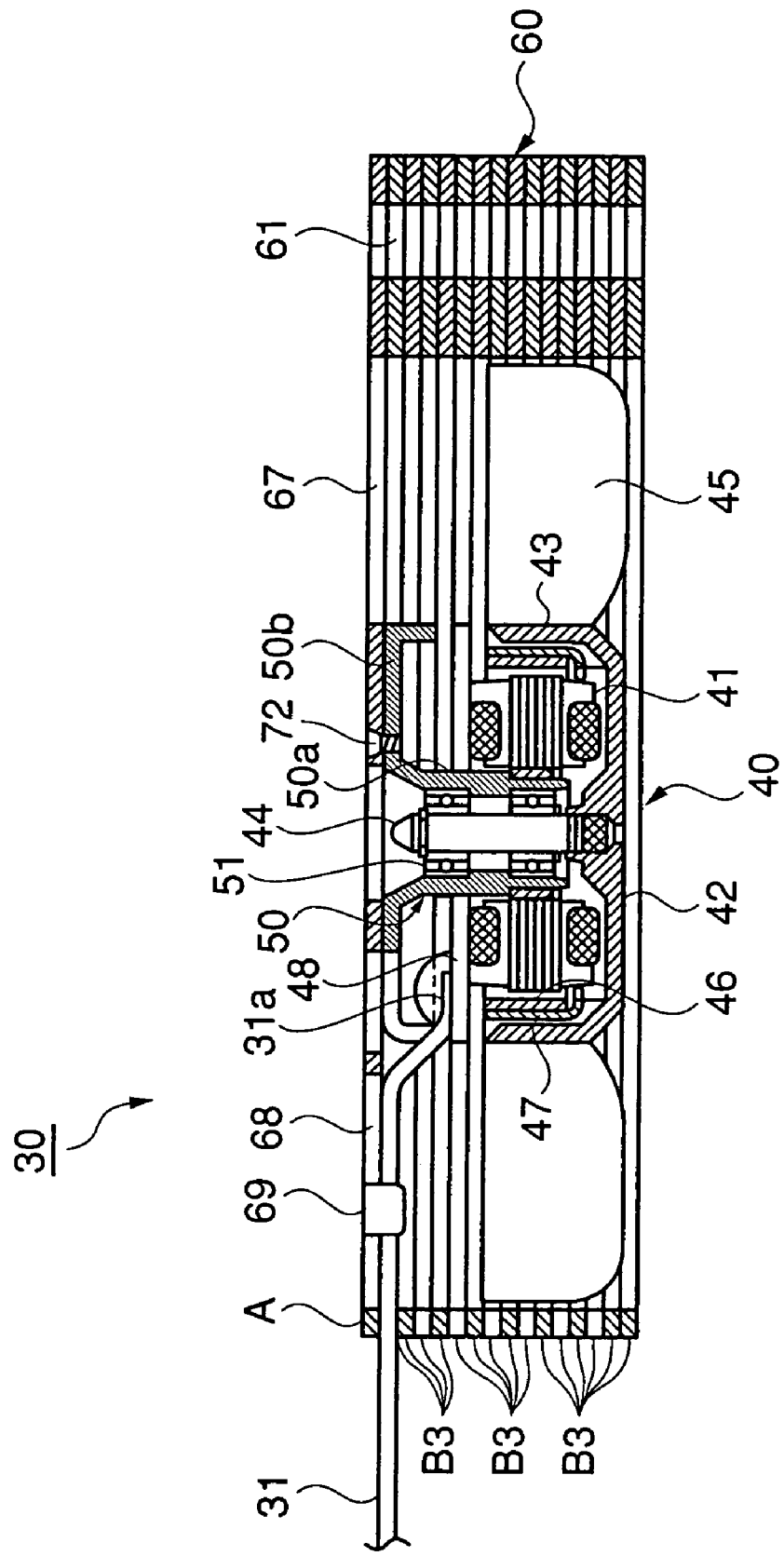
FIG. 13 is a sectional view corresponding to FIG. 12 and showing a modification of the second embodiment.

The angle by which the cutout portions 71 are shifted from each other is not limited to 90 degrees. As shown in FIG. 13, the cutout portions 71 can be shifted from each other by 180 degrees. In this case, the cutout portion 71 appears at the same position every other metal plate B3. When the cutout portions 71 are to be shifted from each other by 90 degrees, the first metal plate A and the metal plates B3 must assume a square outline as viewed from above.

The axial fan motor 30 of the second embodiment differs from that of the first embodiment in the above-mentioned structural feature, but is similar to that of the first embodiment in other structural features. Thus, other structural features are not described.

Through employment of the above configuration, the second embodiment yields the following effects.

All of the plurality of second metal plates B are the metal plates B3. Since metal plates of merely a single kind; i.e., merely the metal plates B3, are used as the second metal plates B, manufacture of the casing 60 is significantly facilitated. Since cooling air flows between the interior of the casing 60 and the exterior of the casing 60 through the cutout portions 71 of the metal plates B3, the efficiency of releasing heat from the casing 60 is more enhanced to thereby more enhance the cooling efficiency of the heat sink 10, as compared to the first embodiment.

The metal plates B3 are laminated such that the angular positions of the cutout portions 71 of the metal plates B3 are successively shifted in the same circumferential direction and such that a phase shift of a predetermined angle is produced between two adjacent cutout portions 71. Since cooling air flows between the interior of the casing 60 and the exterior of the casing 60 through the cutout portions 71 of the metal plates B3 which are circumferentially arranged at predetermined intervals, heat can be uniformly released from the casing 60 to thereby lessen thermal stress in the casing 60. Thus, the durability of the casing 60 can be enhanced. Particularly, when the predetermined angle is 90 degrees, every time four metal plates B3 are laminated, the cutout portions 71 of the metal plates B3 are arranged all around the casing 60. Thus, the above-mentioned effects are further enhanced. Also, the second embodiment yields other effects similar to those which the first embodiment yields.

Figure 14:
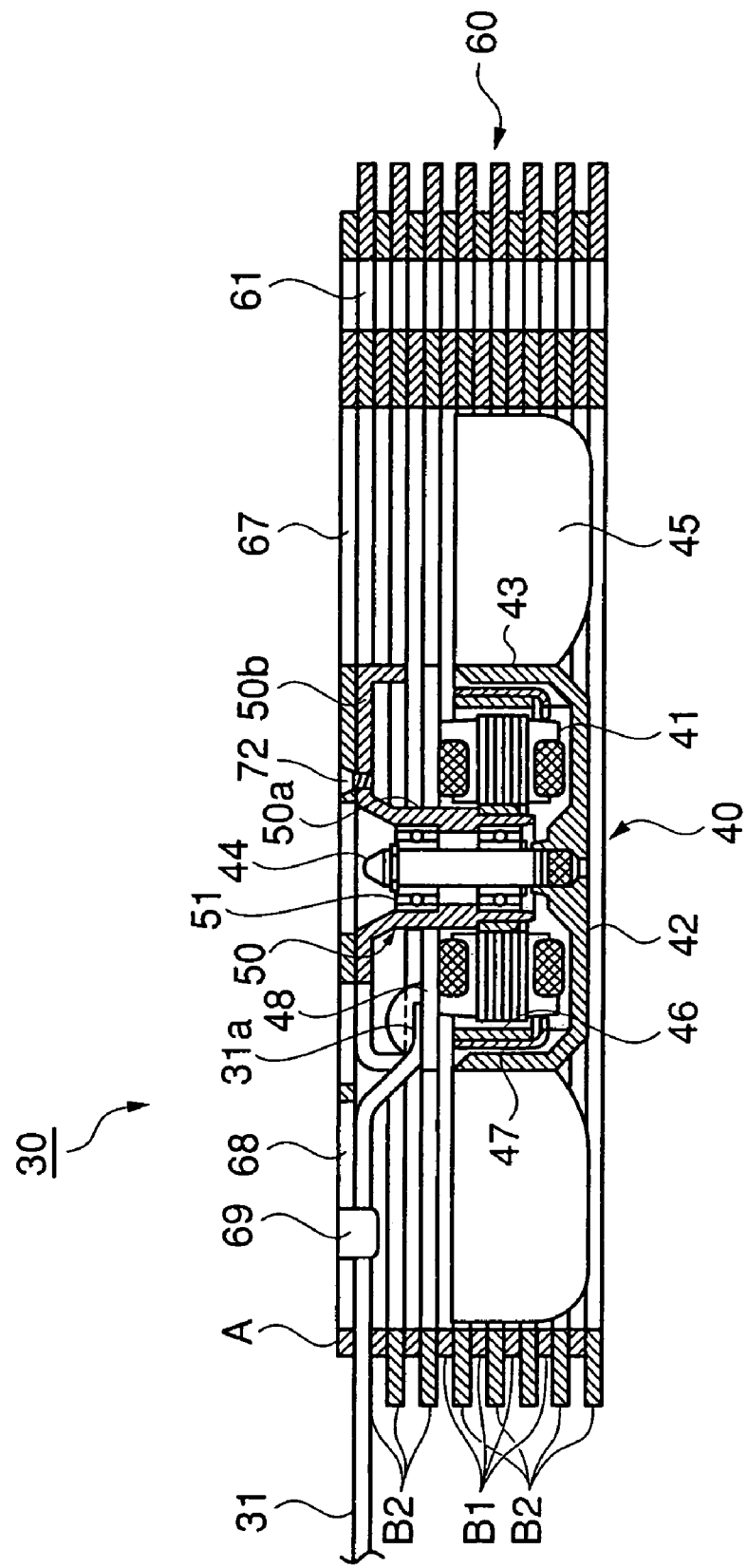
FIG. 14 is a sectional view, corresponding to FIG. 8, of an axial fan motor according to a third embodiment which employs a casing formed by combination of the metal plates B2 of FIG. 6 and the metal plates B1 of FIG. 5, taken along line XIV—XIV of FIG. 15.
Figure 15:
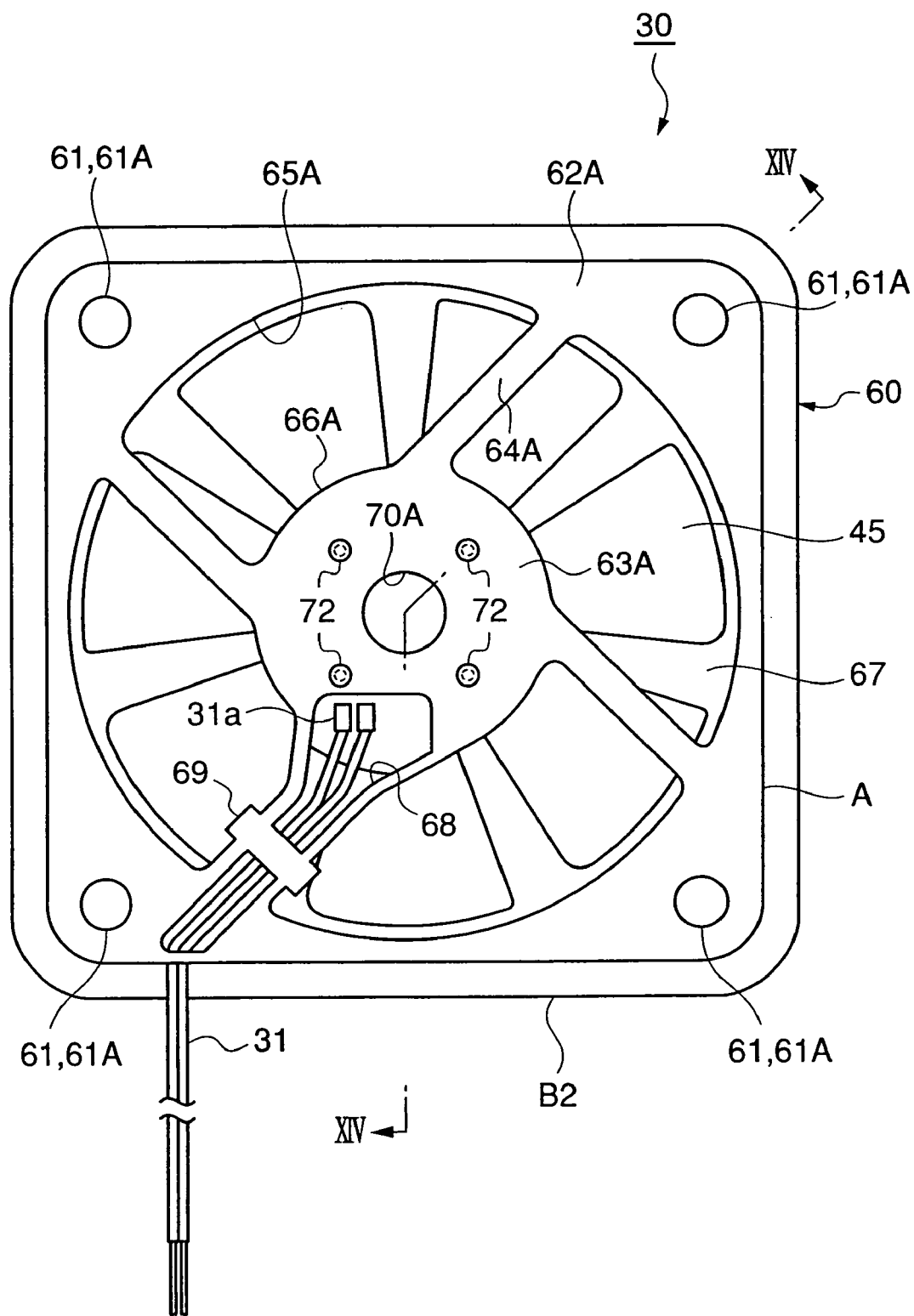
FIG. 15 is a plan view of the axial fan motor according to the third embodiment.

Next, a third embodiment of the present invention will be described in detail with reference to FIGS. 6, 14, and 15.

Figure 6:
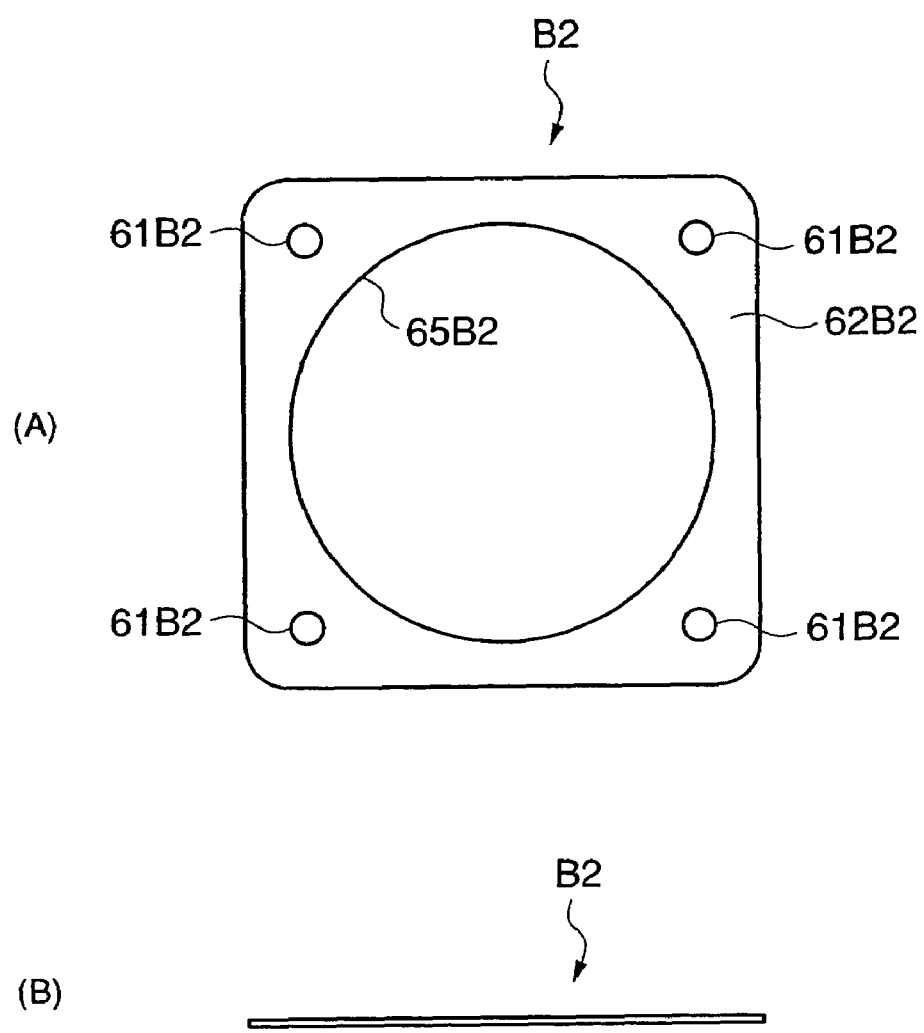
FIG. 6A is a plan view of a metal plate B2 which is a kind of second metal plate B and is one of layers constituting the casing of an axial fan motor according to a third embodiment of the present invention.
FIG. 6B is a side view of the metal plate B2 of FIG. 6A.

FIG. 6 shows a metal plate B2 which is a kind of second metal plate B and is one of layers constituting the casing of an axial fan motor according to the third embodiment. FIG. 6A is a plan view of the metal plate B2, and FIG. 6B is a side view of the metal plate B2. FIG. 14 is a sectional view of the axial fan motor according to the third embodiment which employs the casing formed through combined use of the metal plates B2 and B1, taken along line XIV—XIV of FIG. 15, and corresponds to FIG. 8, which shows the axial fan motor according to the first embodiment. FIG. 15 is a plan view of the axial fan motor according to the third embodiment. Structural features similar to those of the first embodiment are denoted by common reference numerals.

The casing 60 of the axial fan motor 30 of the third embodiment is composed of a single first metal plate A, which is the outermost layer located at the air exhaust side of a fan, and a plurality of second metal plates B. The plurality of second metal plates B are composed of the metal plates B1 shown in FIG. 5 and the metal plates B2 shown in FIG. 6 such that the metal plates B1 and B2 are laminated alternately.

As shown in FIG. 6, the metal plate B2 includes a peripheral portion 62B2 having a circular inner edge 65B2 and assumes an outline of greater size than the outline of the metal plate B1. As shown in FIGS. 14 and 15, the casing 60 is configured such that such metal plates B2 and the metal plates B1 used in the first embodiment are laminated alternately under the first metal plate A. Accordingly, the side walls of the casing 60 assume such a rugged profile that peripheral edge portions of the metal plates B2 project beyond the peripheral edges of the metal plates B1.

The axial fan motor 30 of the third embodiment differs from that of the first embodiment in the above-mentioned structural feature, but is similar to that of the first embodiment in other structural features. Thus, other structural features are not described.

Through employment of the above configuration, the third embodiment yields the following effects.

The plurality of second metal plates B are composed of the metal plates B1 and B2 such that the metal plates B1 and B2 are laminated alternately. Thus, peripheral edge portions of the metal plates B2 which project beyond the peripheral edges of the metal plates B1 serve as fins. As a result, as compared with the first embodiment, the efficiency of releasing heat from the casing 60 is more enhanced to thereby more enhance the cooling efficiency of the heat sink. Also, the third embodiment yields other effects similar to those which the first embodiment yields.

Figure 16:
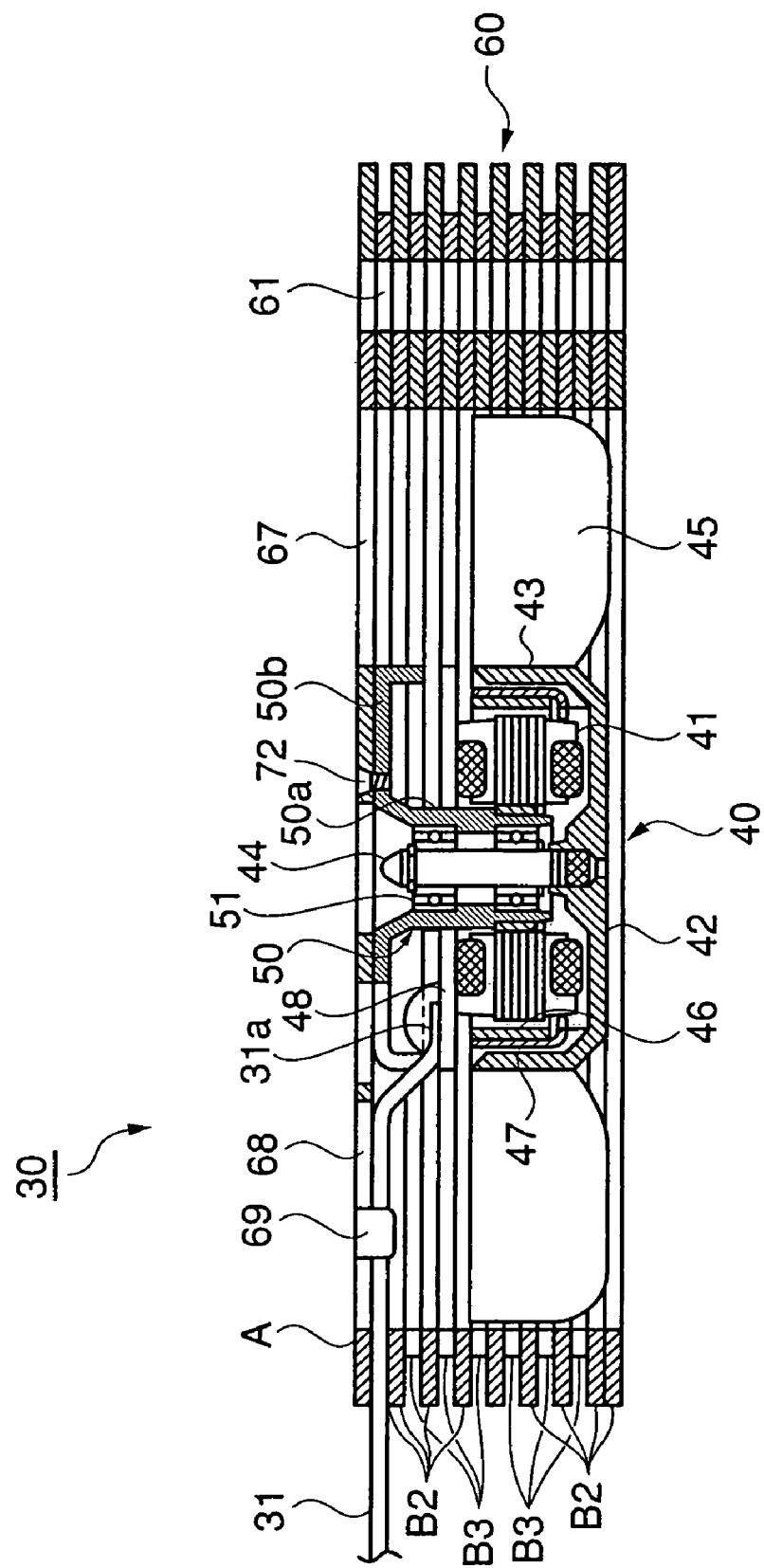
FIG. 16 is a sectional view corresponding to FIG. 14 and showing a modification of the third embodiment.

The third embodiment uses the first metal plate A and the metal plates B1 used in the first embodiment and assuming the same outline. However, the present invention is not limited thereto. As shown in FIG. 16, the outline of the first metal plate A can be expanded to that of the metal plate B2, to thereby improve the appearance of the axial fan motor 30.

Next, a fourth embodiment of the present invention will be described in detail with reference to FIG. 17.

Figure 17:
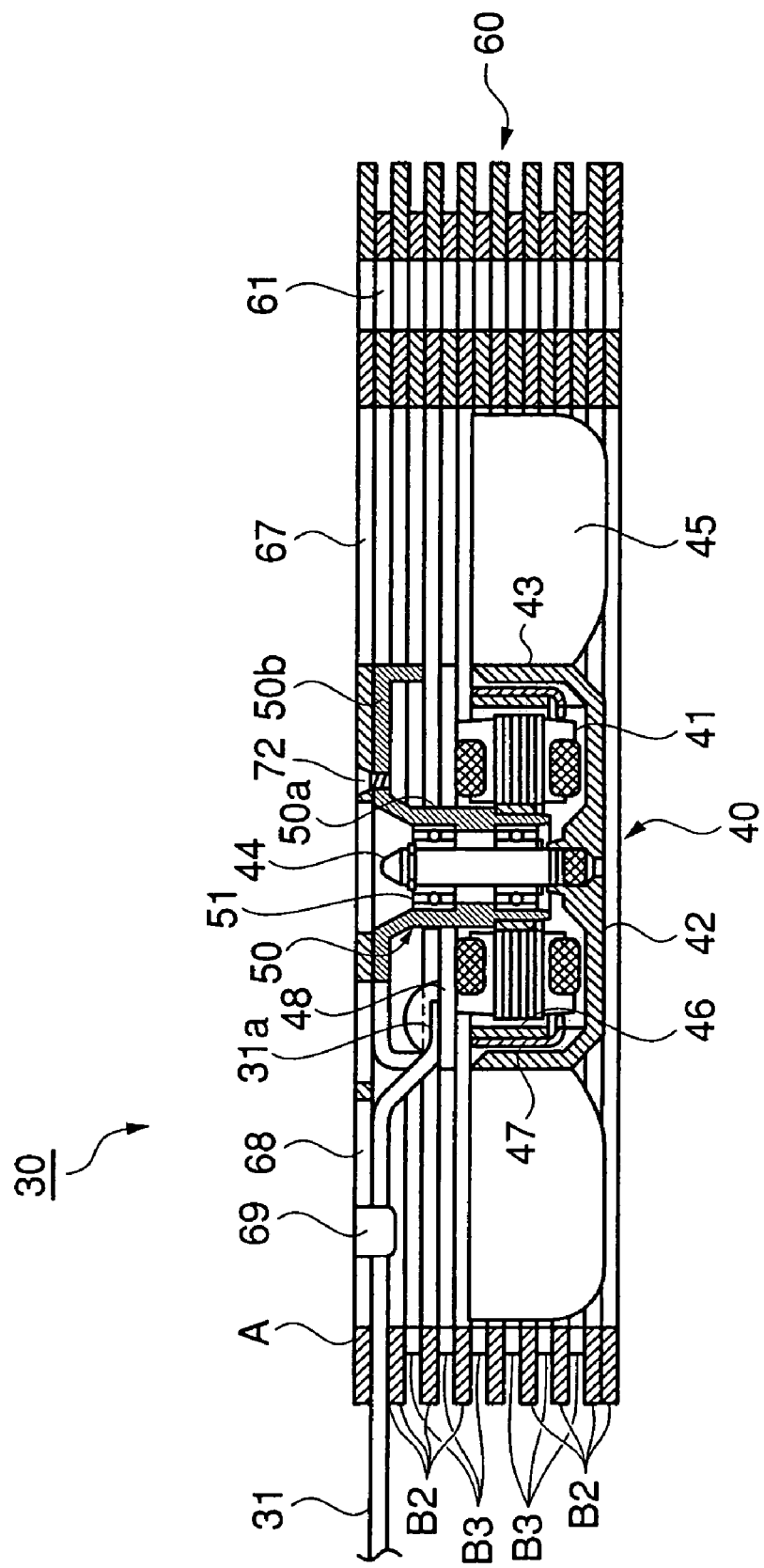
FIG. 17 is a sectional view corresponding to FIG. 16 and showing an axial fan motor according to a fourth embodiment of the present invention.

FIG. 17 is a sectional view of an axial fan motor according to the fourth embodiment and corresponds to FIG. 16 showing a modification of the third embodiment. Structural features similar to those of the third embodiment are denoted by common reference numerals.

The casing 60 of the axial fan motor 30 of the fourth embodiment is composed of a single first metal plate A, which is the outermost layer located at the air exhaust side of a fan, and a plurality of second metal plates B. The plurality of second metal plates B are composed of the metal plates B2 (FIG. 6) and the metal plates B3 (FIG. 7) such that the metal plates B2 and B3 are laminated alternately. The metal plates B3 are used in place of the metal plates B1 used in the casing 60 of the axial fan motor 30 of the third embodiment.

The plurality of metal plates B3 are arranged such that the cutout portions 71 are oriented in the same direction. The first metal plate A used in the present embodiment is the expanded metal plate A used in the modification (see FIG. 16) of the third embodiment.

The axial fan motor 30 of the fourth embodiment differs from that of the third embodiment in the above-mentioned structural feature, but is similar to that of the third embodiment in other structural features. Thus, other structural features are not described.

Through employment of the above configuration, the fourth embodiment yields the following effects.

The plurality of second metal plates B are composed the metal plates B2 and B3 such that the metal plates B2 and B3 are laminated alternately. Since peripheral edge portions of the metal plates B2 which project beyond the peripheral edges of the metal plates B3 serve as fins, and cooling air flows between the interior of the casing 60 and the exterior of the casing 60 through the cutout portions 71 of the metal plates B3, the efficiency of releasing heat from the casing 60 is greatly enhanced to thereby greatly enhance the cooling efficiency of the heat sink. Also, the fourth embodiment yields other effects similar to those which the third embodiment yields.

Next, a fifth embodiment of the present invention will be described in detail.

The axial fan motor 30 of the fifth embodiment (not shown) is a modification of the axial fan motor 30 of the fourth embodiment. The metal plates B2 and B3 are alternately laminated such that the angular positions of the cutout portions 71 of the metal plates B3 are successively shifted in the same circumferential direction and such that a phase shift of a predetermined angle is produced between two adjacent cutout portions. Preferably, the predetermined angle is 90 degrees or 180 degrees as in the case of the second embodiment.

The axial fan motor 30 of the fifth embodiment differs from that of the fourth embodiment in the above-mentioned structural feature, but is similar to that of the fourth embodiment in other structural features. Thus, other structural features are not described.

Through employment of the above configuration, the fifth embodiment yields the following effects. Since cooling air flows between the interior of the casing 60 and the exterior of the casing 60 through the cutout portions 71 of the metal plates B3 which are circumferentially arranged at predetermined intervals, heat can be uniformly released from the casing 60 to thereby lessen thermal stress in the casing 60. Thus, the durability of the casing 60 can be enhanced. Particularly, when the predetermined angle is 90 degrees, every time four metal plates B3 are laminated, the cutout portions 71 of the metal plates B3 are arranged all around the casing 60. Thus, the above-mentioned effects are further enhanced. Also, the fifth embodiment yields other effects similar to those which the fourth embodiment yields.

Next, a sixth embodiment of the present invention will be described in detail with reference to FIG. 18.

Figure 18:
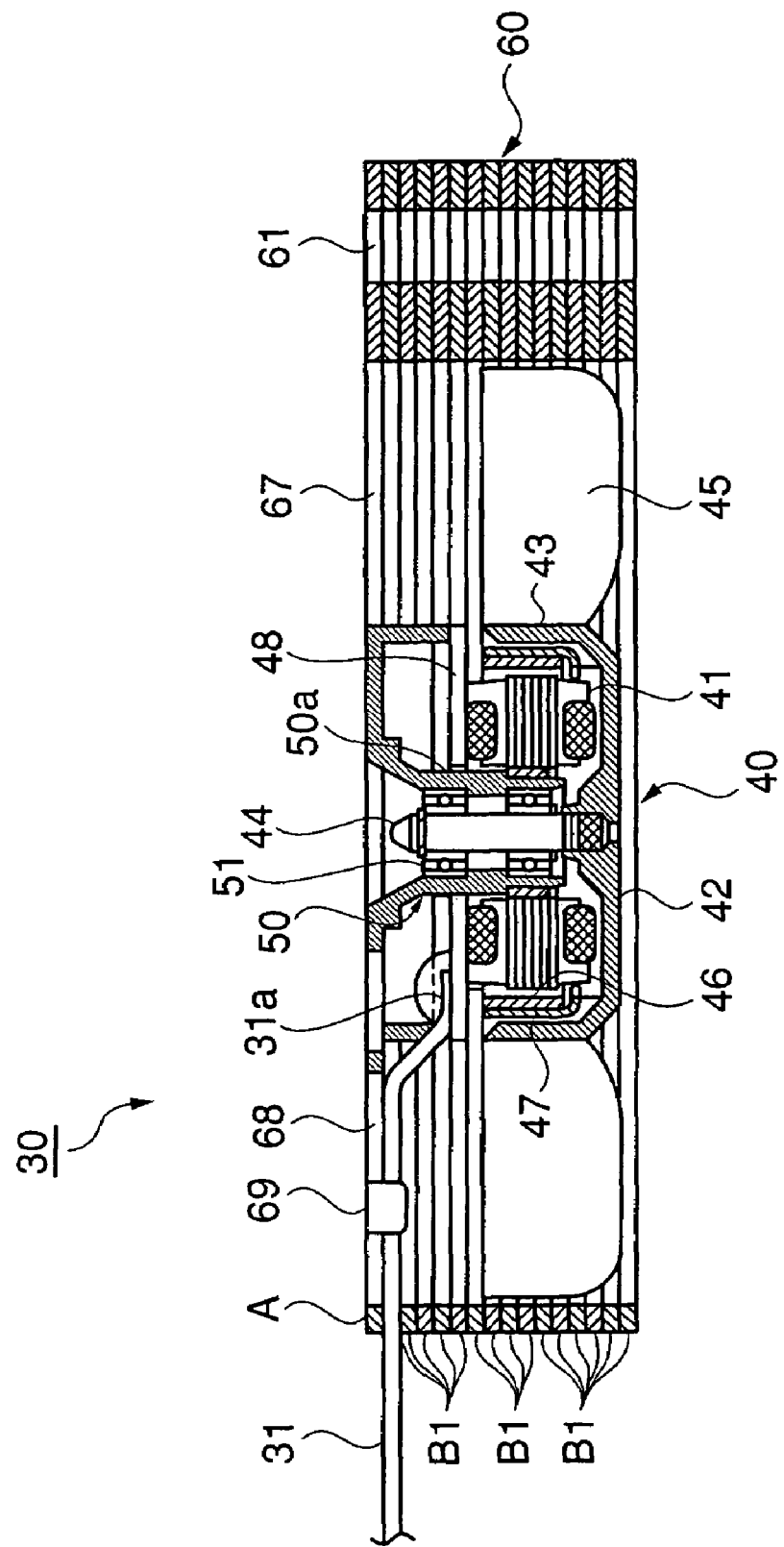
FIG. 18 is a sectional view corresponding to FIG. 8 and showing an axial fan motor according to a sixth embodiment of the present invention.

FIG. 18 is a sectional view of an axial fan motor according to the sixth embodiment and corresponds to FIG. 8 showing the first embodiment. Structural features similar to those of the first embodiment are denoted by common reference numerals.

The axial fan motor 30 of the sixth embodiment is configured such that the first metal plate A of the casing 60 and the bearing holder 50 are integrally formed of the same metal.

The axial fan motor 30 of the sixth embodiment differs from that of the first embodiment in the above-mentioned structural feature, but is similar to that of the first embodiment in other structural features. Thus, other structural features are not described.

As compared with the first embodiment, the above-mentioned structural feature more simplifies assembly of the casing 60 and the main body 40 (the stationary portion 41 and the rotary portion 42) of the axial fan motor 30 to thereby more simplify the assembled structure of the axial fan motor 30. Also, the sixth embodiment yields other effects similar to those which the first embodiment yields.

Next, a seventh embodiment of the present invention will be described in detail.

The casing 60 of the axial fan motor 30 of the seventh embodiment is configured such that a plurality of metal plates and a single or a plurality of resin plates are arranged in layers (laminated).

The single or plurality of resin plates include at least a single resin plate C, which is the outermost layer located at the air exhaust side of a fan. As in the case of the first metal plate A which partially constitutes the casing 60 of the axial fan motor 30 of the first to sixth embodiment, the resin plate C (not shown) includes a peripheral portion having a circular inner edge; a central portion having a circular-outer edge; and a plurality of arm portions for connecting the peripheral portion and the central portion. A bearing holder of a rotary shaft of the fan is attached to the central portion. In some case, the casing 60 may not include resin plates except the outermost resin plate C located at the air exhaust side of the fan.

The axial fan motor 30 of the seventh embodiment differs from that of the first embodiment in the above-mentioned structural feature, but is similar to that of the first embodiment in other structural features. Thus, other structural features are not described.

Since a resin plate(s) partially constitutes the casing 60, the cooling efficiency of the heat sink 10 drops slightly as compared with the first embodiment. However, the weight and cost of the casing 60 drop to thereby enable a further reduction in weight and cost of electronic equipment. Since the casing can be manufactured from a plurality of metal plates, a single or a plurality of resin plates, and connection means (such as rivets, bolts, or adhesive), the following effect is yielded. In contrast to a casing manufactured by use of dies, which involves smoothing of a portion of a cast casing corresponding to mating surfaces of the dies, deburring, and dimensional finishing, the casing 60 can be manufactured without the involvement of such machining processes, thereby facilitating manufacture and enhancing productivity. Also, the seventh embodiment yields other effects similar to those which the first embodiment yields.

Next, an eighth embodiment of the present invention will be described in detail.

The axial fan motor 30 of the eighth embodiment is configured such that a bearing holder and a resin plate C which partially constitutes the casing 60 and is the outermost layer located at the air exhaust side of a fan are integrally formed of the same resin through molding.

The axial fan motor 30 of the eighth embodiment differs from that of the seventh embodiment in the above-mentioned structural feature, but is similar to that of the seventh embodiment in other structural features. Thus, other structural features are not described.

As compared with the seventh embodiment, the above-mentioned structural feature more simplifies assembly of the casing 60 and the main body 40 (the stationary portion 41 and the rotary portion 42) of the axial fan motor 30 to thereby more simplify the assembled structure of the axial fan motor 30. Also, the eighth embodiment yields other effects similar to those which the seventh embodiment yields.

Next, a ninth embodiment of the present invention will be described in detail.

The axial fan motor 30 of the ninth embodiment includes air rectification means for straightening cooling air. The air rectification means (not shown) is disposed between the axial fan motor 30 and the shroud 20 and assumes the form of an air rectification cylinder equipped with a plurality of air rectification blades.

The axial fan motor 30 of the ninth embodiment differs from that of the first embodiment in the above-mentioned structural feature, but is similar to that of the first embodiment in other structural features. Thus, other structural features are not described.

Through employment of the above-described structure, cooling air which is caused to flow by the axial fan motor 30 of the ninth embodiment involves no whirls in contrast to the first embodiment. Also, as compared with the first embodiment, an adverse effect of the main body 40 (the stationary portion 41 and the rotary portion 42) located at a central portion of the axial fan motor 30 on cooling air flow can be greatly eased, thereby greatly suppressing a phenomenon that an air flow rate at a central portion of the axial fan motor 30 becomes lower than that at a peripheral portion of the axial fan motor 30. Thus, the cooling air can reach deep into the heat sink 10 along its fins 12, whereby the heat sink 10 can be cooled more uniformly to thereby further enhance the cooling efficiency of the heat sink 10. Also, the ninth embodiment yields other effects similar to those which the first embodiment yields.

According to the ninth embodiment, the air rectification means is interposed between the axial fan motor 30 and the shroud 20. However, the present invention is not limited thereto. For example, a plurality of air rectification blades can be disposed at a central cutout portion of the support base 21 of the shroud 20.

Next, a tenth embodiment of the present invention will be described in detail.

According to the tenth embodiment, the cooling unit 1 equipped with the axial fan motor 30 is configured in the following manner. The shroud 20 and a single plate (a metal plate or a resin plate) which is one of layers constituting the casing 60 of the axial fan motor 30 and is the outermost layer located at the air intake side of a fan are integrally formed of the same material.

The cooling unit 1 equipped with the axial fan motor 30 according to the tenth embodiment differs from that of the first embodiment in the above-mentioned structural feature, but is similar to that of the first embodiment in other structural features. Thus, other structural features are not described.

In contrast to the first embodiment, through employment of the above configuration, the tenth embodiment facilitates assembly of the shroud 20 and the casing 60 of the axial fan motor 30. Thus, the axial fan motor 30 can be readily mounted above the heat sink 10. Also, the tenth embodiment yields other effects similar to those which the first embodiment yields.

What is claimed is:

1. An axial fan motor for a cooling unit, adapted to air-cool a heat sink of a heat generating device, said axial fan motor being disposed on one side of said heat sink, opposite said heating element, and adapted to feed cooling air into the interior of said heat sink, said axial fan motor comprising:
   a rotor and a plurality of fan blades attached to an outer circumferential surface of the rotor;
   a casing surrounding said rotor and blades and defining a flow passage for flow of cooling air between said rotor and said casing and for directing the cooling air into the heat sink;
   a bearing holder on which a stator of said motor, disposed inside said rotor, is fixed, said bearing holder supporting a rotary shaft of said motor via a bearing and connecting said stator to said casing, said rotor being fixed to said rotary shaft, wherein:
   said casing is formed of a plurality of metal plates laminated along the axial direction of said rotary shaft, said plurality of metal plates comprising:
   a single first metal plate, which is an outermost metal plate of said casing and which is located at an air exhaust side, said first metal plate including a peripheral portion having a circular inner edge, a center portion having a circular outer edge, and a plurality of arm portions connecting the peripheral portion and the central portion, said bearing holder being attached to the central portion; and
   a plurality of second metal plates with outer edges defining a peripheral surface for said casing and extending inwardly from the outer edges to circular inner edges defining a central opening, said second metal plates each having a cutout extending completely through from the central opening to the peripheral surface for the passage of cooling air.

2. An axial fan motor for a cooling unit according to claim 1, wherein said second metal plates are arranged such that the angular positions of the cutouts of said second metal plates are successively shifted in the same circumferential direction and such that a phase shift of a predetermined angle is produced between two adjacent cutouts.

3. An axial fan motor for a cooling unit according to claim 2, wherein the predetermined angle is 90 degrees.

4. An axial fan motor for a cooling unit according to claim 1, wherein said first metal plate and the bearing holder are integrally formed of the same metal.

5. An axial fan motor for a cooling unit according to claim 1, wherein one of said arm portions has a window formed therein so as to allow viewing therethrough of at least a terminal of a lead wire, and holder means for holding a lead wire.

6. A cooling unit comprising:
   an axial fan motor according to claim 5; and
   a shroud for mounting said axial fan motor above a heat sink, wherein
   said shroud includes a support base having a central portion cut out and on which a casing of said axial fan motor is mounted, and a plurality of legs extending downward from a plurality of positions on a peripheral edge of said support base;
   said support base covers and is thermally connected to the heat sink, and end portions of said legs are engaged with a base of the heat sink, whereby said shroud is fixedly attached to the heat sink; and
   said shroud and a plate serving as an outermost layer located at an air intake side of a fan of said axial fan motor and partially constituting the casing of said axial fan motor are integrally formed of the same material.

7. An axial fan motor for a cooling unit, adapted to air-cool a heat sink of a heat generating device, said axial fan motor being disposed on one side of said heat sink, opposite said heating element, and adapted to feed cooling air into the interior of said heat sink, said axial fan motor comprising:
   a rotor and a plurality of fan blades attached to an outer circumferential surface of the rotor;
   a casing surrounding said rotor and blades and defining a flow passage for flow of cooling air between said rotor and said casing and for directing the cooling air into the heat sink;
   a bearing holder on which a stator of said motor, disposed inside said rotor, is fixed, said bearing holder supporting a rotary shaft of said motor via a bearing and connecting said stator to said casing, said rotor being fixed to said rotary shaft, wherein:
   said casing is formed of a plurality of metal plates laminated along the axial direction of said rotary shaft, said plurality of metal plates comprising:
   a single first metal plate, which is an outermost metal plate of said casing and which is located at an air exhaust side, said first metal plate including a peripheral portion having a circular inner edge, a center portion having a circular outer edge, and a plurality of arm portions connecting the peripheral portion and the central portion, said bearing holder being attached to the central portion;
   a plurality of second metal plates extending outwardly from circular inner edges to peripheral edges, the second metal plates each having a cutout extending completely through from the central opening to the peripheral surface for the passage of cooling air; and
   a plurality of third metal plates, without said cutouts, arranged alternately with said second metal plates in series, said third metal plates having outer edges projecting beyond the peripheral edges of the second metal plates, whereby the second and third metal plates define a peripheral surface with fins for the casing.

8. An axial fan motor for a cooling unit according to claim 7 wherein said second and third second metal plates are arranged alternately such that the angular positions of the cutouts of said second metal plates are successively shifted in the same circumferential direction and such that a phase shift of a predetermined angle is produced between two adjacent cutouts.

* * * * *